US007365322B2

(12) United States Patent
Miyamoto et al.

(10) Patent No.: US 7,365,322 B2
(45) Date of Patent: Apr. 29, 2008

(54) METHOD AND APPARATUS FOR ARRANGING RECIPE OF SCANNING ELECTRON MICROSCOPE AND APPARATUS FOR EVALUATING SHAPE OF SEMICONDUCTOR DEVICE PATTERN

(75) Inventors: Atsushi Miyamoto, Yokohama (JP);
Wataru Nagatomo, Yokohama (JP);
Ryoichi Matsuoka, Yotsukaido (JP);
Hidetoshi Morokuma, Hitachinaka (JP); Takumichi Sutani, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 128 days.

(21) Appl. No.: 11/330,215

(22) Filed: Jan. 12, 2006

(65) Prior Publication Data
US 2006/0284081 A1   Dec. 21, 2006

(30) Foreign Application Priority Data
Jun. 21, 2005   (JP)   ............................. 2005-180457

(51) Int. Cl.
*G21K 7/00* (2006.01)
(52) U.S. Cl. ........................ 250/310; 250/307; 324/751
(58) Field of Classification Search ...................... None
See application file for complete search history.

(56) References Cited

U.S. PATENT DOCUMENTS
2007/0045536 A1 *   3/2007   Nakasuji et al. ............ 250/310

FOREIGN PATENT DOCUMENTS
JP   2000-348658   12/2000
JP   2002-328015   11/2002

* cited by examiner

*Primary Examiner*—Nikita Wells
*Assistant Examiner*—Zia R. Hashmi
(74) *Attorney, Agent, or Firm*—Antonelli, Terry, Stout & Kraus, LLP.

(57) ABSTRACT

In order to provide an imaging-recipe arranging or creating apparatus and method adapted so that selection rules for automatic arrangement of an imaging recipe can be optimized by teaching in a SEM apparatus or the like, the imaging-recipe arranging or creating apparatus in this invention that arranges an imaging recipe for SEM-observing a semiconductor pattern using a scanning electron microscope includes a database that receives and stores layout information of the above semiconductor pattern in a low-magnification field, and an imaging-recipe arranging unit which, on the basis of the database-stored semiconductor pattern layout information, arranges the imaging recipe automatically in accordance with the automatic arrangement algorithm that includes teaching-optimized selection rules for selecting an imaging point(s).

29 Claims, 12 Drawing Sheets

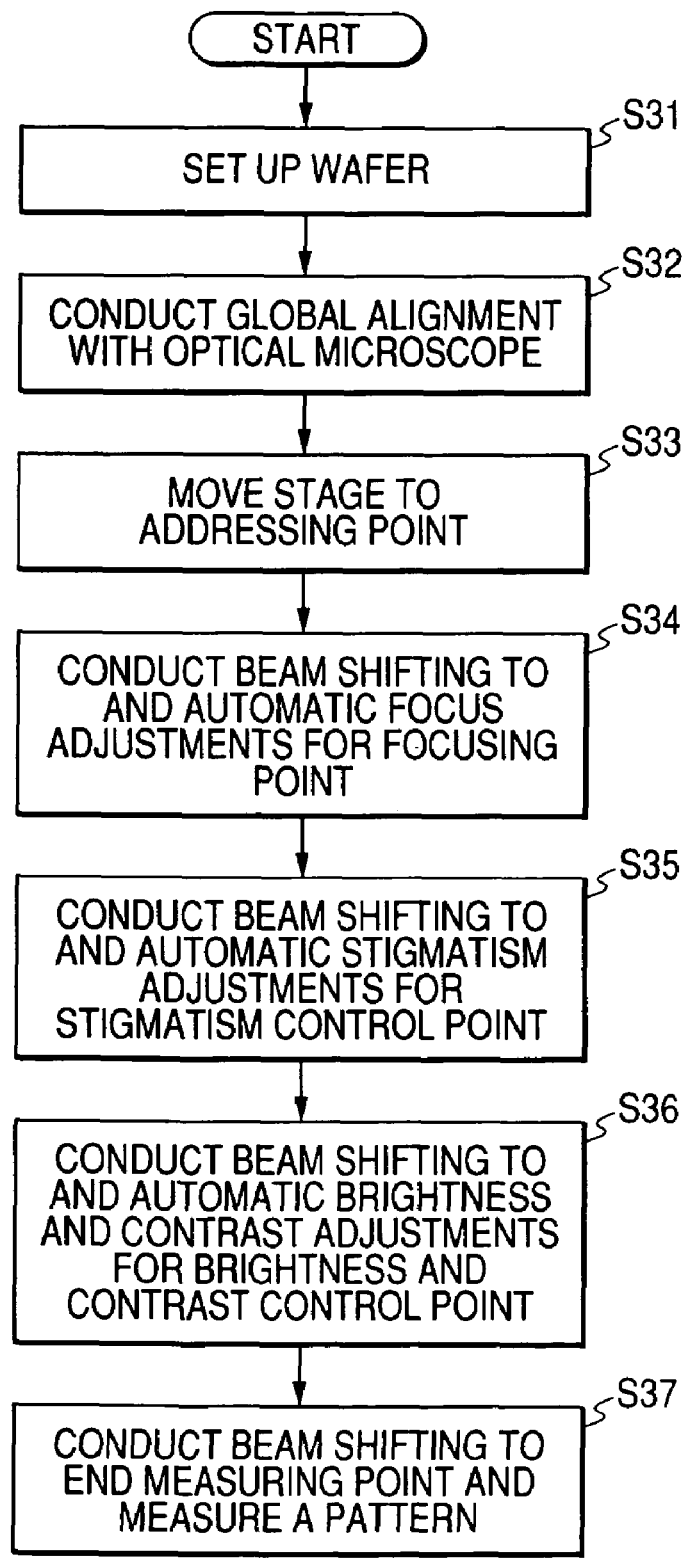

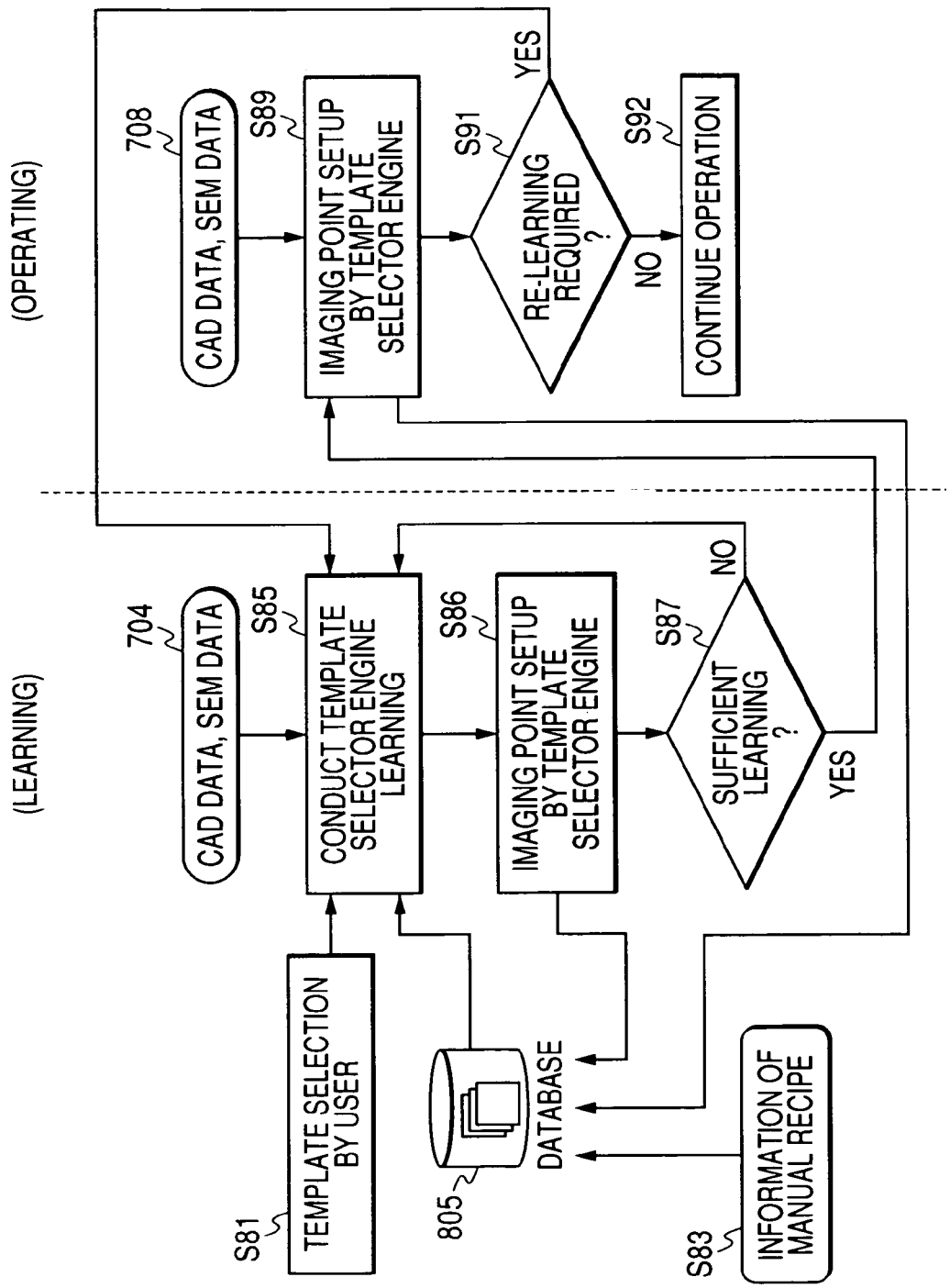

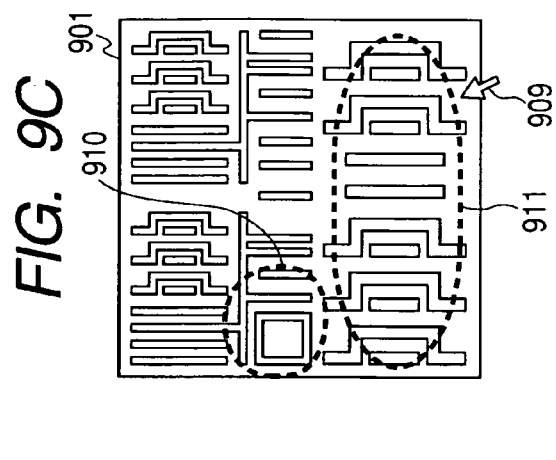
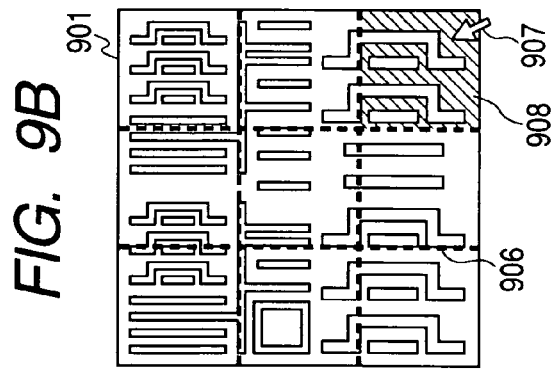
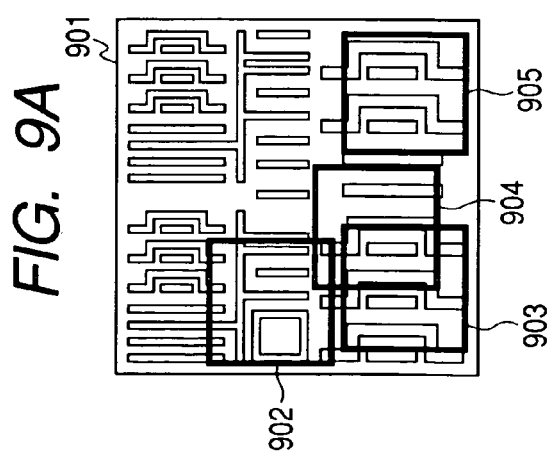
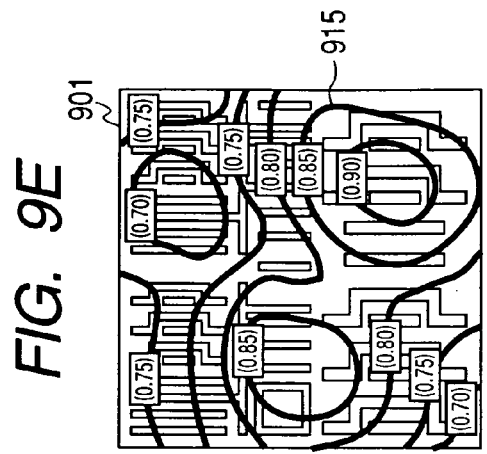
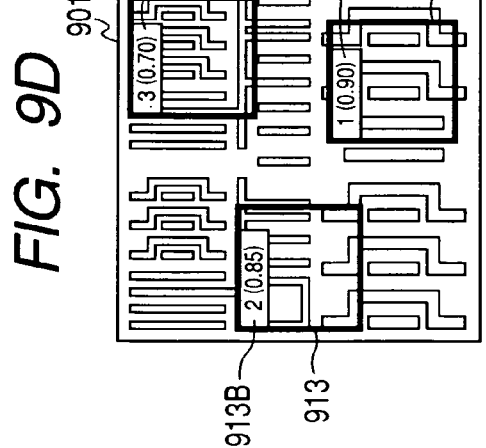

METHOD AND APPARATUS FOR ARRANGING RECIPE OF SCANNING ELECTRON MICROSCOPE AND APPARATUS FOR EVALUATING SHAPE OF SEMICONDUCTOR DEVICE PATTERN

BACKGROUND OF THE INVENTION

The present invention relates to a method and apparatus for arranging or creating recipes for imaging with a critical-dimension scanning electron microscope (CD-SEM), wherein each of the recipes defines not only the coordinates of the addressing point (AP), focusing point (FP), stigmatic point (SP), brightness/contrast control point (BP), or end measuring point (EP) used to acquire images at any position on a sample with the CD-SEM, but also those image templates or imaging parameters (or the like) that are associated with the above coordinates. The invention is also concerned with a shape evaluation apparatus (SEM apparatus) for semiconductor patterns.

Traditionally, the CD-SEM is most commonly used as measuring apparatus to inspect by measuring the workmanship of the highly accurate wiring patterns formed on semiconductor wafers. In SEM apparatus such as the CD-SEM, dimensionally critical points on the semiconductor patterns that require inspection are observed as end measuring points through the SEM, then various dimensional data on the patterns, such as wiring widths, are measured from the images acquired during the observation process, and the dimensional data is monitored to detect changes in process parameters.

To perform these inspections, it is necessary to arrange the imaging recipes that define the coordinates of imaging points, imaging parameters, image templates of each imaging point, and other data.

Japanese Patent Laid-Open No. 2002-328015 is known as a publication that discloses a technique for arranging recipes for imaging with such a SEM apparatus.

Japanese Patent Laid-Open No. 2002-328015 describes a semiconductor inspection system constituted by two subsystems. One is a navigation system that stores design information of a semiconductor wafer such as CAD data or the like and sets the imaging/inspection parameters including the regions of the semiconductor wafer that are to be inspected, based on the stored design information. The other is a scanning electron microscopic system that acquires images of the semiconductor wafer in accordance with the set imaging/inspection parameters and inspects the wafer. According to Japanese Patent Laid-Open No. 2002-328015, this semiconductor inspection system also has a function that detects the position of an addressing point (AP) from the CAD data and registers the CAD data of this detected position as a template. In addition, this system has a function that acquires a SEM image at the AP, then matching processes between the acquired SEM image and the registered CAD template at the AP, and re-registers a SEM image corresponding to the position of the CAD template as an another template, thereafter to use the re-registered SEM template subsequently.

For the semiconductor inspection system of described in Japanese Patent Laid-Open No. 2002-328015, however, the linear image created from the CAD data (for example, an image on which only the boundary of a mask for a resist is delineated as edges) is used to determine imaging points manually or automatically. Therefore, there has been the problem that appropriate imaging points cannot be selected because unbridgeable gulf of externals between the above linear image and an actual SEM image is large.

(1) Also, since the arrangement of an imaging recipe requires operator's knowledge such as what kind of pattern is to be selected as an AP to succeed in addressing, how to define the above knowledge as process rules in the system becomes important during automatic recipe arrangement.

(2) In addition, the above-mentioned imaging recipe is not of such a nature that it needs only to be arranged one time, and the AP, FP, SP, BP, or EP to be set is likely to change according to the subject of imaging (namely, the particular differences in process rule or manufacturing process) or the imaging parameters to be used, or other factors. Accordingly, it becomes important how to update the imaging recipe in rapid response to such changes in the imaging subject or in the imaging conditions.

(3) Furthermore, after constructing the system for implementing such automatic recipe arrangement as mentioned above, it becomes important how to judge the appropriateness of the imaging recipe that has been generated per arbitrary selection rules in the above system, or how to judge the appropriateness of the selection rules. Besides, it becomes important how to perform corrections if the imaging recipe or the selection rules are judged to be inappropriate.

SUMMARY OF THE INVENTION

The present invention provides an imaging recipe arrangement apparatus and method adapted so that selection rules for automatic arrangement or creation of an imaging-recipe in a SEM apparatus or the like can be optimized by teaching.

The present invention also provides a semiconductor pattern shape evaluation apparatus and method that can use the above-optimized imaging-recipe and SEM apparatus or the like to measure at high speed and accurately a large number of portions to be inspected, estimate semiconductor device characteristics and manufacturing process states, and feed back measurement and estimation results to various process sites.

That is to say, an aspect of the present invention is an imaging recipe arrangement apparatus and method for arranging or creating an imaging-recipe for SEM-based observation of a semiconductor pattern by use of a scanning electron microscope. The apparatus has a database obtained by receiving layout information of the above semiconductor pattern, in a low-magnification field, and storing the layout information. The apparatus also has an imaging recipe arrangement unit that uses the database-stored layout information of the semiconductor pattern to arrange the imaging-recipe automatically in accordance with an automatic arrangement algorithm.

Another aspect of the present invention is an imaging recipe arrangement apparatus and method for arranging or creating an imaging-recipe for SEM observation of a semiconductor pattern by use of a scanning electron microscope, wherein the imaging recipe includes coordinates of imaging points, and an image template and/or imaging conditions associated with the coordinates. The apparatus has a database obtained by receiving in a low-magnification field of view (a first SEM-image field-of-view) and storing either the images acquired using the scanning electron microscope, CAD data that describes (defines) design information of the semiconductor pattern, or the layout information of this semiconductor pattern that is a set of CAD images obtained by converting the CAD data into image data. The apparatus also has an imaging recipe arrangement unit that uses the database-stored layout information of the semiconductor pattern to arrange the imaging-recipe automatically in accordance with an automatic arrangement algorithm including the imaging point selection rules that have been optimized by teaching.

Yet another aspect of the present invention is an imaging recipe arrangement apparatus and method for arranging or creating an imaging recipe from on-wafer pattern layout information in a low-magnification field of view. The kinds of input information obtained as the on-wafer pattern layout information in the low-magnification field of view, include either the SEM images or CAD data generated in the low-magnification field of view, or the CAD images obtained by converting the CAD data into image data. Hereinafter, the SEM images, CAD data, or CAD images thus obtained are collectively called "low-magnification images."

The present invention features automatic arrangement of an imaging recipe. More specifically, rules for selecting the imaging points that include one or more than one or all of five points, AP, FP, SP, BP, and EP, are optimized by teaching. One method available to implement such teaching is by a user by specifying an imaging point(s) arbitrarily on a low-magnification image. Another available teaching method is by saving, in a database, any of the imaging points that have been selected in the past, and respective learning parameters of the selection rules that have been arranged in the past (for example, weighting information between the selection factors described later herein), and then referring, from the database, a data set suitable for selection of a desired template. Such teaching enables the imaging recipe to be updated in rapid response to changes in the kind of imaging subject or in data settings of imaging conditions. More specifically, the kinds of information to be saved in the database include a part or all of imaging recipe information or low-magnification images (CAD data or SEM data) or observed imaging point positions and templates or imaging subjects (manufacturing processes included) or imaging parameters and/or learning parameters. Learning samples (combinations of low-magnification images and imaging points) can be stored early by sharing the database between multiple pieces of SEM apparatus. Additionally, the database or a recipe server or the like can be used to share the arranged imaging recipe between the multiple pieces of SEM apparatus.

According to the present invention, selection rules for automatic arrangement of an imaging recipe can be easily established by processing such as teaching or weight adjustment. It is therefore possible to rapidly accommodate changes in process where a wafer is manufactured, in process where a wafer is imaged, in imaging conditions, and in the like.

These and other objects, features, and advantages of the invention will be apparent from the following more particular description of preferred embodiments of the invention, as illustrated in the accompanying drawings.

BRIEF DESCRIPTION OF THE DRAWINGS

FIG. 3 is a diagram showing an embodiment of an imaging sequence in the SEM apparatus according to the present invention;

FIG. 8 is a diagram showing an example of total process flow during automatic arrangement of an imaging recipe according to the present invention;

FIG. 9A is a diagram showing the state existing after a plurality of imaging points within a low-magnification image have been specified using a keyboard or a mouse;

FIG. 9B is a diagram showing the state existing after an imaging point has been specified from the plurality of split region segments contained in a low-magnification image;

FIG. 9C is a diagram showing the state existing after an imaging point has been specified within a free curve drawn on the screen displaying a low-magnification image;

FIG. 9D is a diagram showing a state in which a calculated imaging point and a set of selection index data on appropriateness of the imaging point are displayed on a display screen displayed the low-magnification image;

FIG. 9E is a diagram showing a state in which a distribution of selection index data on the appropriateness of the imaging point is displayed on a display screen displayed the low-magnification image;

DESCRIPTION OF THE PREFERRED EMBODIMENTS

Embodiments of a SEM apparatus with an imaging recipe arrangement function according to the present invention, namely, a semiconductor pattern shape evaluation apparatus using a scanning electron microscope such as a critical-dimension scanning electron microscope (CD-SEM), will be described hereunder using FIGS. 1 to 12.

The number of inspection portions that require dimensional management of semiconductor patterns may be increasing greatly because of factors for such as decreases in design margins according to making minutely and making high density of LSI patterns. These tendencies are bringing about a strong demand for the improvement of the throughput and automation ratio of a SEM apparatus or like apparatus used as a dimensional management tool.

To use a SEM apparatus (or the like) for performing SEM-based observations for the critical points as dimension-measuring points on the semiconductor pattern to be inspected, and evaluating pattern shapes by measuring the wiring widths and other various dimensions of the patterns from the images obtained during the observations, it is necessary to determine not only the coordinates of a part or all of the five imaging points including an addressing point (AP), a focusing point (FP), a stigmatic point (SP), a brightness/contrast correction point (BP), and an end measuring point (EP), but also imaging conditions (an imaging magnification and other factors related to image quality, such as a layer, dose of electron beam, focus condition, and stigmatism correction) of the part or all of the five imaging points, and register image templates at each imaging point. The coordinates of these imaging points, the imaging conditions thereof, and image template information thereof are collectively called an imaging recipe.

The present invention is an imaging recipe arrangement apparatus and method adapted so that selection rules for selecting an imaging point(s) in a SEM apparatus or the like can be optimized by teaching. The optimization makes it possible to measure at high speed and accurately a large number of portions to be inspected, estimate semiconductor device characteristics and manufacturing process states, and feed back measurement and estimation results to various process sites.

1: SEM Apparatus 1.1: SEM Apparatus Configuration

Figure 1:
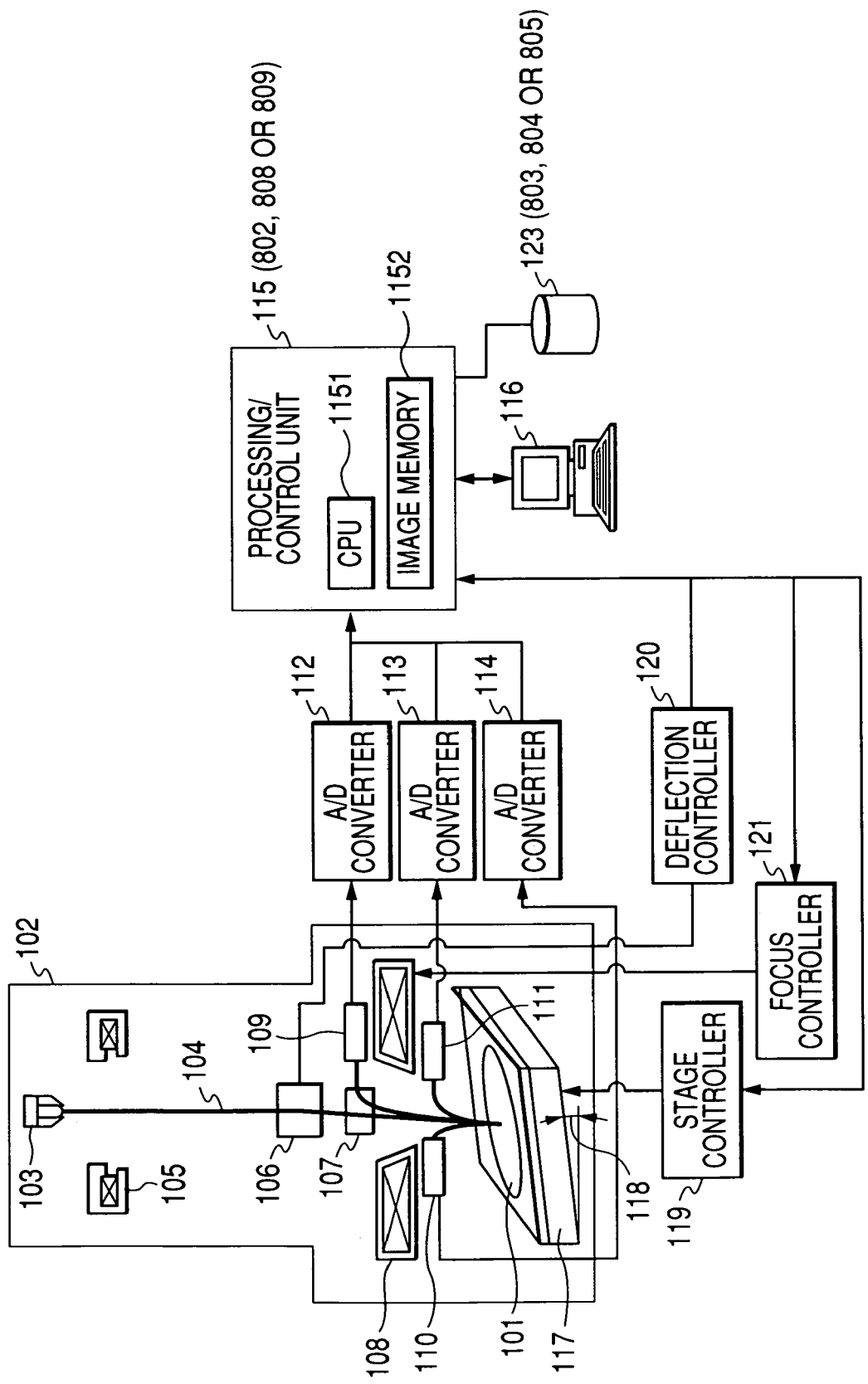
FIG. 1 is a schematic block diagram showing an embodiment of a SEM apparatus according to the present invention.

FIG. 1 is a schematic block diagram of a scanning electron microscope (SEM) apparatus (tool) which acquires a secondary electron image (SE image) or backscattered electron image (BSE image) of a sample in the present invention. The SE image and the BSE image are collectively called a SEM image. Also, the image acquired here includes a part or all of a top-down image of an object-under-measurement when the object is observed from a vertical direction, or of a tilt image of the object when observed from any oblique direction.

An electron optical system 102 includes an electron gun 103 that generates an electron beam (primary electron) 104, a condenser lens 105 that converges the electron beam 104 generated from the electron gun 103, a deflector 106 that deflects the converged electron beam 104, an ExB deflector 107 that detects a secondary electron, and an objective lens 108 that focuses converged electron beam on a sample (semiconductor wafer) 101. The sample 101 is rested on an XY stage 117. On the result, the deflector 106 and the objective lens 108 work together to control an irradiation position and aperture stop of the electron beam so that the electron beam is irradiated in a focused condition at any position on the sample 101 rested on the stage 117. Incidentally, the XY stage moves the sample 101 and enables an image of the sample at any position thereof to be acquired. Changing an observing position using the XY stage 117 is called "stage shifting", and changing the observing position by deflecting the electron beam using the deflector 106 is called "beam shifting."

In the meantime, a secondary electron and backscattered electrons are emitted from the semiconductor wafer 101 that has been irradiated with the electron beam. The secondary electron is detected by a secondary electron detector 109, and the backscattered electrons are detected by backscattered electron detectors 110, 111. The backscattered electron detectors 110 and 111 are installed to face in directions different from each other. The secondary electron and backscattered electrons that have been detected by the secondary electron detector 109 and the backscattered electron detectors 110, 111, respectively, are each converted into digital signal form by A/D converters 112, 113, 114. These digital signals, after being next input to a processing/control unit 115 and then stored into an image memory 1152, are sent to a CPU 1151 to execute evaluation of geometries (shapes) of the semiconductor patterns including the dimensions thereof by executing image processing appropriate for particular needs. In the CPU 1151, processing shown in FIG. 3, for example, is executed, then various dimension values of a pattern, such as a wiring width, are measured, and measured dimension values are monitored to detect changes in process parameters.

The processing/control unit 115 (in FIGS. 5A to 5C, denoted as 802, 808, or 809) is connected to a stage controller 119 that controls a position and movement of the stage 117. The control of the stage position and movement includes global alignment control conducted to compensate for any deviations of the wafer 101 from a home position thereof and for any rotational errors of the wafer that obtains by observing global alignment marks on the wafer 101 using an optical microscope (not shown) etc. The processing/control unit 115 is also connected to a deflection controller 120 that controls beam shifting (beam deflection) of electron beam by controlling the deflector 106, and a focus controller 121 that controls beam focus by controlling the objective lens 108. Additionally, the processing/control unit 115 (802, 808, or 809) is connected to a display unit 116 having an input device so as to have functions as a graphic user interface (GUI) to display images and others to a user.

Figure 2A:
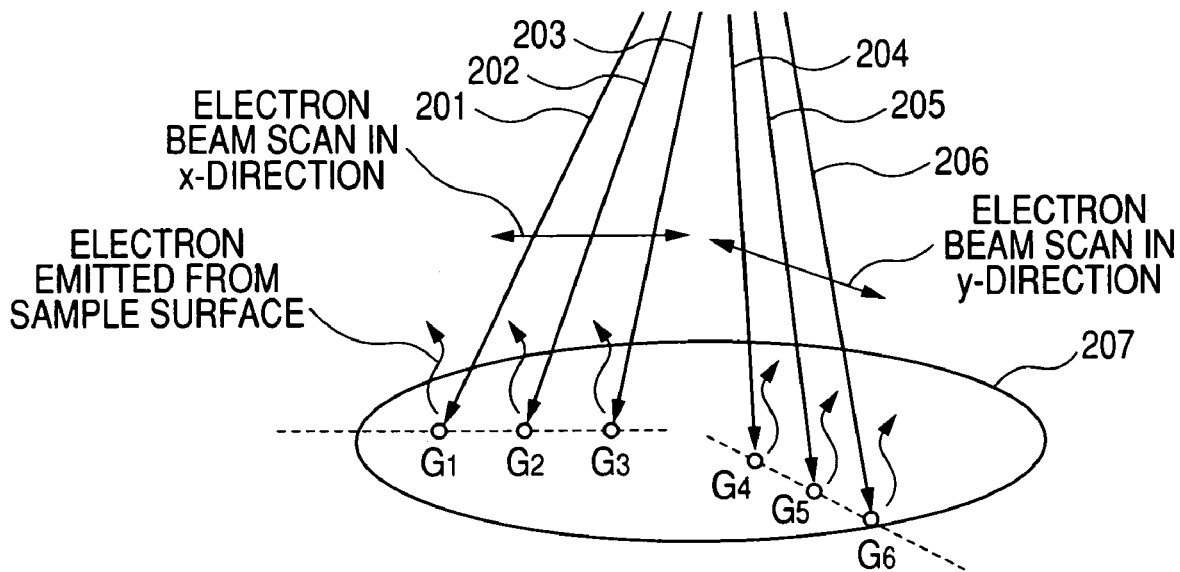
FIG. 2A is a diagram showing a semiconductor wafer when it is being scanned with electron beams, and showing a state of the electrons emitted from the wafer.
Figure 2B:
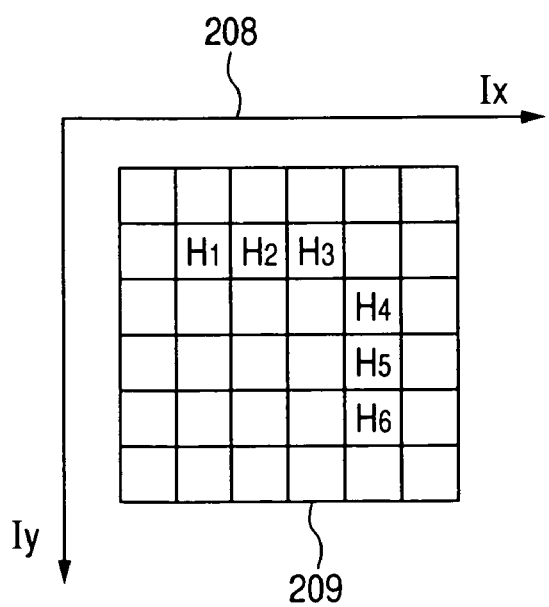
FIG. 2B is a diagram showing, in image form, signal levels of the electrons emitted from the wafer surface.

FIGS. 2A and 2B show a method in which, when the surface of the semiconductor wafer is scanned with electron beams and irradiated therewith, signal levels of the electrons emitted from the semiconductor wafer surface are converted into image form. For example, the electron beams are, as shown in FIG. 2A, irradiated in forms of 201-203 or 204-206 to conduct scans in x- and y-directions. Changing a deflecting direction of the electron beams enables a scanning direction to be changed. Three locations on the semiconductor wafer that has been irradiated with the electron beams 201-203 in the x-direction are denoted as $G_1$ to $G_3$, respectively. Similarly, three locations on the semiconductor wafer that has been irradiated with the electron beams 204-206 in the y-direction are denoted as $G_4$ to $G_6$, respectively. The signal levels (amounts) of the emitted electrons at the locations $G_1$ to $G_6$ are expressed as brightness values (gray scale values) of pixels $H_1$ to $H_6$ within the image 209 shown in FIG. 2B. Subscripts 1 to 6 at lower right portions of the locations G are associated with subscripts 1 to 6, respectively, assigned to the locations H. Reference number 208 is a coordinate system (Ix, Iy) that denotes the x- and y-directions on image I.

Reference number 115 in FIG. 1 denotes a computer system. The computer system 115 sends control signals to the stage controller 119 and the deflection controller 120 in order to implement imaging at AP (addressing point), FP (focusing point), SP (stigmatic point), BP (brightness/contrast correction point), or EP (end measuring point), based on the imaging recipe arranged by the image-processing and recipe arrangement/arithmetic unit 806 or 809 shown in FIG. 4. The computer system 115 also executes evaluation of shape including dimensions in the semiconductor pattern by executing processing and control function for executing various types of image processing or the like for the image at the observing point on the wafer 101. In addition, the processing/control unit 115 is connected to the display unit 116 having an input device that has a graphic user interface (GUI) to display images and others to the user. Reference number 117 denotes an XY stage, which moves the semiconductor wafer 101 and enables an image of this semiconductor wafer at any position thereof to be acquired. Changing an observing position using the XY stage 117 is called "stage shifting", and changing the observing position by deflecting the electron beam using the deflector 106 is called "beam shifting."

Although an example of a SEM apparatus configuration with two backscattered electron image detectors is shown in FIG. 1, this number of backscattered electron image detectors can be either reduced or increased. Also, part or all of the above-mentioned processing and control functions of the computer system 115 can be allocated to a plurality of different processing terminals to provide required processing and control.

The following are available as methods in which a tilt image of an object to be measured, namely, an image of the object when observed from any oblique direction, is to be obtained using the apparatus shown in FIG. 1:

(1) A method for forming an inclined image by deflecting an irradiated electron beam via the electron optical system and then inclining an irradiation angle of the electron beam. A similar scheme is described, for example, in Japanese Patent Laid-Open No. 2000-348658.

(2) A method for inclining the stage 117 itself that moves the semiconductor wafer (in FIG. 1, the stage is inclined at a tilt angle 118).

(3) A method for mechanically inclining the electron optical system itself.

1.2: SEM Imaging Sequence

FIG. 3 shows an imaging sequence for observing any end measuring point (hereinafter, called EP). A portion to be imaged in the imaging sequence, and imaging conditions to be used therein (i.e., an imaging magnification, other factors related to image quality such as a dose of an electron beam, focusing condition, and stigmatism correction) and end measuring condition at EP are arranged as the imaging recipe by the image-processing and recipe arrangement/arithmetic unit 806 or 809 shown in FIGS. 5A-5C. These arranged imaging factors are stored into and managed by, for example, a storage unit (database) 123 (803, 804, or 805).

First, the semiconductor wafer 101 as a sample, is set up on the stage 117 of the SEM apparatus in step S31. Next, in step S32, the processing/control unit 115 (802, 808, or 809) calculates a deviation of the sample from a home position thereof and a rotational deviation of the sample by observing the global alignment marks on the wafer through an optical microscope (not shown), and conducts corrections by controlling the stage 117 via the stage controller 119 on the basis of those deviations. In step S33, the processing/control unit 115 (802, 808, or 809) moves the imaging position to an addressing point (AP) in accordance with the coordinate and imaging condition of the imaging point (AP) arranged by the image-processing and recipe arrangement/arithmetic unit 806 or 809, by moving the stage 117, and acquires an image using an imaging condition of a lower-magnification than for EP (end measuring point).

A supplementary description of AP is given here. For direct observation of EP, in order to solve the problem that the observation portion shifts (deviates) by the reasons for stage-positioning accuracy and the like, AP whose coordinates pre-registered in, for example, the storage unit 123 (803, 804, or 805) are known is first observed for pre-positioning. Then, the processing/control unit 115 (802, 808, or 809) conducts position matching between an image template at the AP previously arranged by the image-processing and recipe arrangement/arithmetic unit 806 or 809 and stored into, for example, the storage unit 123 (803, 804, or 805), and a SEM image at the above-observed AP. The processing/control unit 115 thus detects the vector denoting a deviation between central coordinates of the image template and those of the AP when this point is actually observed as the SEM image.

Next, the processing/control unit 115 (802, 808, or 809) subtracts the above-detected deviation vector from a relative vector between the coordinates of the image template and those of EP, and then controls the deflector 106 via the deflection controller 120 according to the difference vector obtained by the subtraction. This control operation moves the imaging position by beam shifting to enable observation of EP, whereby EP can be imaged with high coordinate accuracy (in general, positioning accuracy by beam shifting is higher than the positioning accuracy of the stage).

Therefore, the AP arranged by the image-processing and recipe arrangement/arithmetic unit 806 or 809 and stored into, for example, the storage unit 123 (803, 804, or 805), should desirably satisfy conditions such as ease of matching between the registered image template and the observed SEM image. There are three reasons for the above: (1) the AP is a pattern present at a distance through which the imaging position can be moved from EP by beam shifting, and a field of view (FOV) for EP imaging may not need to be included in FOV of AP imaging to suppress generation of contamination at EP; (2) since the pattern of the AP needs to allow for the positioning accuracy of the stage, it is necessary for the AP to be correspondingly lower than EP in conditions of the imaging magnification in consideration of the positioning accuracy of the stage; and (3) the pattern needs to be characteristic in terms of shape or brightness (the pattern is of a shape convenient for matching or has brightness). As described later herein, according to the present invention, automatic selection of appropriate AP is possible by evaluating the above-described conditions in the system (for example, the image-processing and recipe arrangement/arithmetic unit 806 or 809).

In order to avoid image acquisition intended only to register a CAD image or a SEM image or, as disclosed in Japanese Patent Laid-Open No. 2002-328015, an image template, one possible variation of an AP image template registration method is by first registering with a CAD template in, for example, the storage unit 123 (803, 804, or 805) and then re-registering the SEM image actually acquired at AP, as the image template.

Next, in step S34, beam shifting based on the control and processing of the processing/control unit 115 (802, 808, or 809) is conducted to move the imaging position to a focusing point (FP), at which an image is then acquired and automatic focusing parameters are calculated. Thus, automatic focusing is conducted using the calculated automatic focusing parameters.

A supplementary description of FP is given here. During imaging, automatic focusing is conducted to acquire a clearer image. Extended irradiation of the sample 101 with electron beams, however, causes contamination to stick to the sample. For minimum sticking of contamination at EP, therefore, the processing/control unit 115 (802, 808, or 809) observes a coordinate point present near EP, as FP, and calculates automatic focusing parameters at the FP, thereafter EP is observed by using the calculated automatic focusing parameters.

For these reasons, the FP registered in, for example, the storage unit 123 (803, 804, or 805), should desirably satisfy conditions such as: (1) the FP is a pattern present at a distance through which the imaging position can be moved from the AP or EP by beam shifting, and the field of view (FOV) for AP or EP imaging must not be included in the FOV of FP imaging; (2) the imaging magnification at the FP is of much the same level as that of EP; and (3) the FP needs to have a pattern shape convenient for execution of automatic focusing (image blurring due to an out-of-focus event must be easy to detect). According to the present invention, an appropriate imaging point (FP) is automatically selectable, as with the AP, by evaluating the above-described conditions in the system (for example, the image-processing and recipe arrangement/arithmetic unit 806 or 809).

Next, in step S35, beam shifting based on the control and processing of the processing/control unit 115 (802, 808, or 809) is conducted to move the imaging position to a stigmatic point (SP), at which an image is then acquired and stigmatism correction parameters are calculated. Thus, automatic stigmatism correction is conducted using the calculated parameters.

A supplementary description of SP is given here. During imaging, stigmatism correction is conducted to acquire a distortion less image. Similarly to AP and FP, however, extended irradiation of the sample 101 with electron beams causes contamination to stick to the sample. For minimum sticking of contamination at EP, therefore, the processing/control unit 115 (802, 808, or 809) observes a coordinate point present near EP, as SP, and calculates stigmatism correction parameters, thereafter EP is observed by using the calculated stigmatism correction parameters. For these reasons, the SP registered in the storage unit 123 (803, 804, or 805) should desirably satisfy conditions such as: (1) the SP is a pattern present at a distance through which the imaging position can be moved from AP or EP by beam shifting, and the field of view (FOV) for AP or EP imaging must not be included in FOV of SP imaging; (2) the imaging magnification at the SP is of much the same level as that of EP; and (3) the SP needs to have a pattern shape convenient for execution of stigmatism correction (image blurring due to stigmatism must be easy to detect). According to the present invention, an appropriate imaging point SP is automatically selectable, as with the AP, by evaluating the above-described conditions in the system (for example, the image-processing and recipe arrangement/arithmetic unit 806 or 809).

Next, in step S36, beam shifting based on the control and processing of the processing/control unit 115 (802, 808, or 809) is conducted to move the imaging position to a brightness and contrast correction point (BP), at which an image is then acquired and brightness and contrast correction parameters are calculated. Thus, automatic brightness and contrast correction is conducted using the calculated parameters.

A supplementary description of BP is given here. During imaging, in order to acquire a clearer image having an appropriate brightness value and contrast, a voltage value and other parameters of a photomultiplier in the secondary electron detector 109, for example, are adjusted so that, for example, the highest level portion of an image signal and the lowest level portion are set to obtain full contrast or a contrast level close thereto. Similarly to AP and FP, however, extended irradiation of the sample with electron beams causes contamination to stick to the sample. For minimum sticking of contamination at EP, therefore, the processing/control unit 115 (802, 808, or 809) observes a coordinate point present near EP, as BP, and calculates brightness and contrast correction parameters, thereafter EP is observed by using the calculated brightness and contrast correction parameters. For these reasons, the BP registered in the storage unit 123 (803, 804, or 805) should desirably satisfy conditions such as: (1) the BP is a pattern present at a distance through which the imaging position can be moved from AP or EP by beam shifting, and the FOV for AP or EP imaging must not be included in the FOV of SP imaging; (2) the imaging magnification at the BP is of much the same level as that of EP; and (3) to obtain appropriate brightness and contrast of the image that has been acquired at the end measuring point using the parameters adjusted at the BP, the BP needs to have a pattern shape similar to that of the above-mentioned end measuring point.

According to the present invention, an appropriate imaging point (BP) is automatically selectable, as with the AP, by evaluating the above-described conditions in the system (for example, the image-processing and recipe arrangement/arithmetic unit 806 or 809).

There is a variation in which, for example, as the case may be, part or all of the automatic focusing, automatic stigmatism correction, and automatic brightness and contrast correction processes described above in steps S34, S35, and S36, respectively, are omitted or execution order of these steps is arbitrarily changed or the coordinates of FP, SP, and/or BP overlap (e.g., automatic focusing and automatic stigmatism correction are conducted in the same portion).

Finally, in step S37, beam shifting based on the control and processing of the processing/control unit 115 (802, 808, or 809) is conducted to move the imaging position to a end measuring point (EP), at which an image is then acquired and pattern dimensions are measured with set measuring conditions to evaluate the shape of the semiconductor pattern.

As described above, the imaging points are considered one or more than one or all of AP, FP, SP, BP, and EP.

Figure 4:
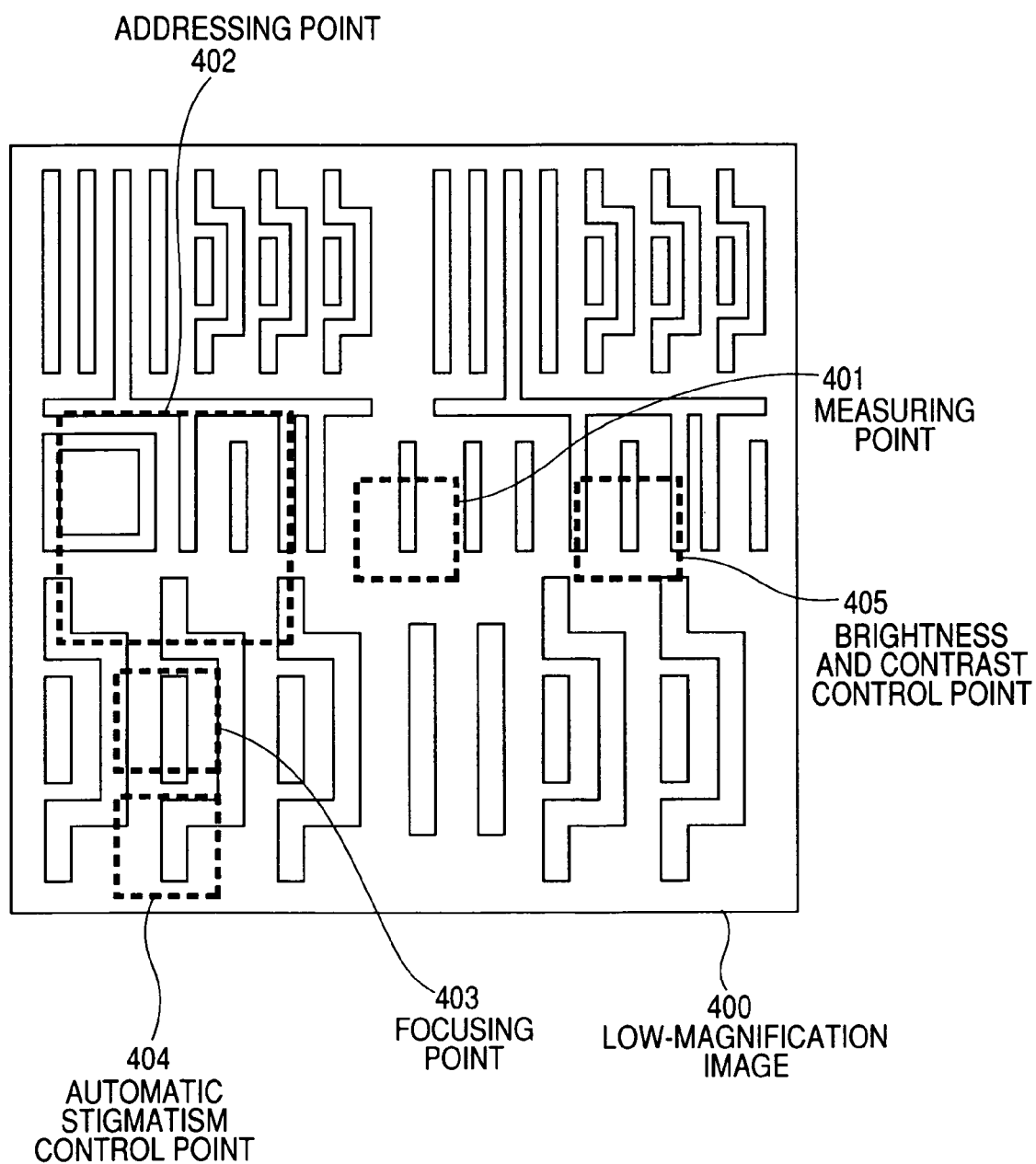
FIG. 4 is a diagram showing various imaging points in a low-magnification image according to the present invention.

An example of template positioning of imaging points AP 402, FP 403, SP 404, BP 405, and EP 401 on a low-magnification image 400 is shown with dotted-line frames in FIG. 4.

In order to avoid image acquisition intended only to register a CAD image or a SEM image or an image template as disclosed in Japanese Patent Laid-Open No. 2002-328015, one possible variation of a method of registering an AP image template in the storage unit 123 (803, 804, or 805) is, for example, by first registering with a CAD template and then re-registering the SEM image actually acquired at AP, as the image template.

2: System Configuration (Database Management and Sharing)

Several embodiments of a system configuration according to the present invention will be described hereunder using FIGS. 5A to 5C.

Figure 5A:
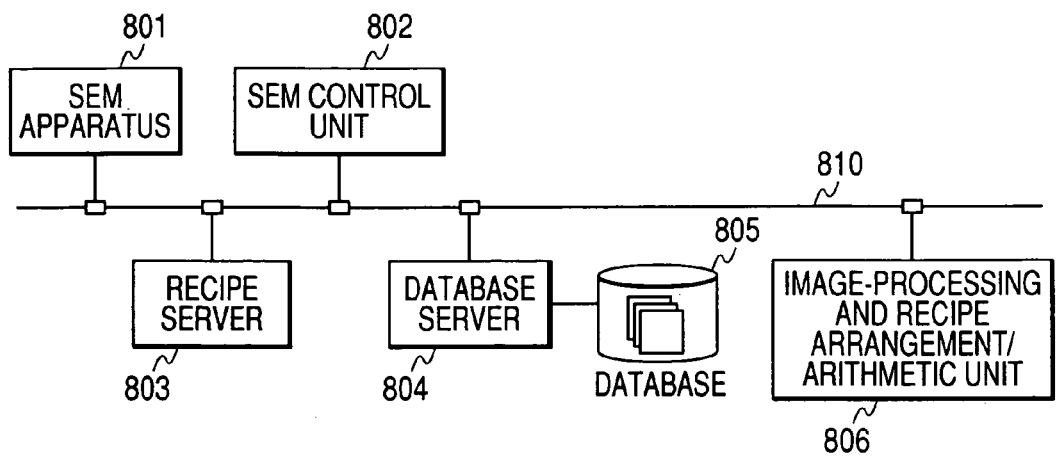
FIG. 5A is a diagram showing a SEM system configuration with one SEM unit

First in FIG. 5A, reference number 801 denotes a SEM apparatus (tool) shown in FIG. 1. Reference number 802 denotes a SEM control unit (this unit has the same control functions of the processing/control unit 115 shown in FIG. 1), and 803 denotes a recipe server in which is registered an imaging recipe that has been arranged by an image-processing and recipe arrangement/arithmetic unit. Reference number 804 denotes a database server, and 806 the image-processing and recipe arrangement/arithmetic unit. The above constituent elements of the system configuration shown in FIG. 5A can exchange information with one another via a network 810. The database server 804 has an installed storage device to enable the foregoing past data to be saved.

Figure 5B:
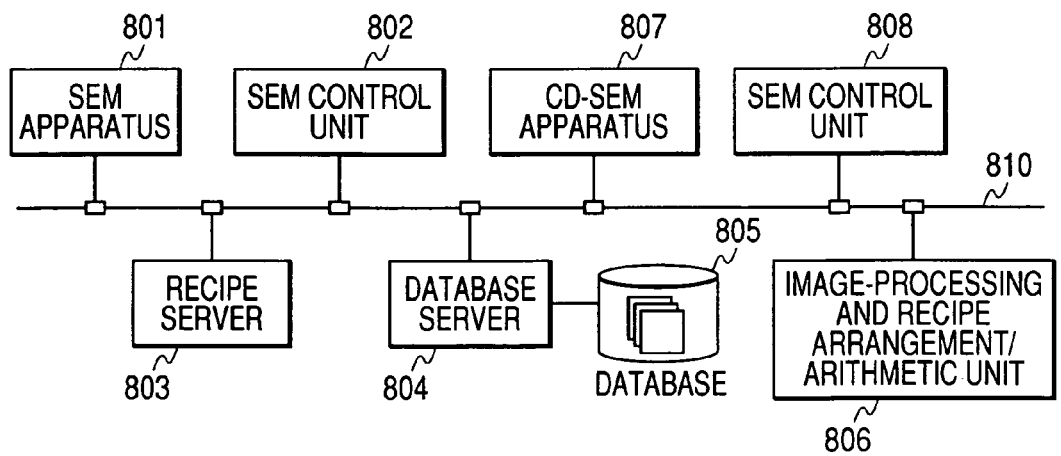
FIG. 5B is a diagram showing a SEM system configuration with two SEM units.

FIG. 5B shows a system configuration in which, in addition to the system configuration of FIG. 5A, one more set comprising of a CD-SEM apparatus (tool) 807 shown in FIG. 1, and a SEM control unit (this unit has the same control functions of the processing/control unit 115) 808, is connected to the network 810. In the present invention, in two or more SEM apparatuses 801 and 807, an image recipe can share by using the recipe server 803 or the database server 804, and the plurality of SEM apparatuses 801, 807 can be operated based on one imaging-recipe arranging in the image-processing and recipe arrangement/arithmetic unit 806. Also, learning samples that can be utilized for teaching can be early stored by sharing a database 805 between the plural SEM apparatuses 801, 807.

Figure 5C:
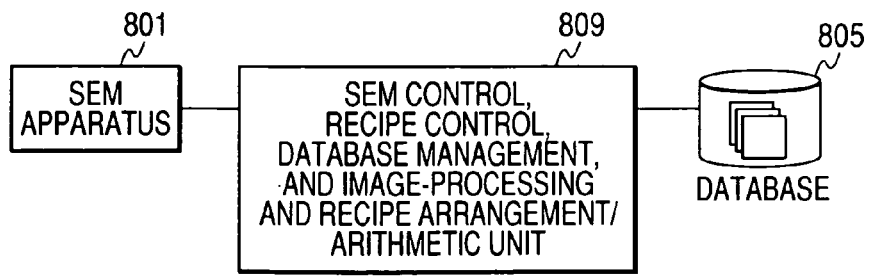
FIG. 5C is a diagram showing a SEM system configuration in which a SEM control unit, a database server, and an arithmetic unit are integrated into a single unit.

FIG. 5C shows a system configuration in which the SEM control unit(s) 802, servers 803, 804, image-processing and recipe arrangement/arithmetic unit 806, and other components in FIG. 5A or 5B, are integrated into a single unit 809. As in the present embodiment, any set of processing functions can be assigned in split or integrated form to any of the plural apparatuses (system components).

Image-processing and recipe arrangement/arithmetic unit 806 or 809 is connected to a display unit (not shown) that has an input device, and thus has the GUI function, or equivalent thereto, shown in FIG. 7 and FIGS. 9A-9E to 12, to thereby display images and others to a user.

3: Automatic Arrangement of an Imaging Recipe in Image-Processing and Recipe Arrangement/Arithmetic Unit (CPU)

Automatic arrangement of an imaging recipe in the image-processing and recipe arrangement/arithmetic unit (CPU) 806 or 809 according to the present invention is executed based on low-magnification field on-wafer pattern layout information. The kinds of input information obtained as the low-magnification field on-wafer pattern layout information, include SEM images, CAD data that describes (defines) design information on the semiconductor pattern, or the CAD images obtained by converting the CAD data into image data in the low-magnification field. Hereinafter, these images and data are collectively called low-magnification images (each equivalent to the foregoing low-magnification image 400 of FIG. 4).

When imaging points are determined from the CAD data and then the CAD data of these imaging points is registered by using CAD data as a low-magnification image, it is not necessary to image the wafer only by the purpose to create templates. Therefore, availability factor of the SEM apparatus can be improved.

The following describes a selector engine for automatic selection of imaging points (part or all of five points, AP, FP, SP, BP, and EP) in the image-processing and recipe arrangement/arithmetic unit (CPU) 806 or 809, based on the low-magnification image as input information that has been input to and registered in the database 805, for example.

3.1: Selector Engine (Selection Factor Indices and Selection Indices)

Figure 6A:
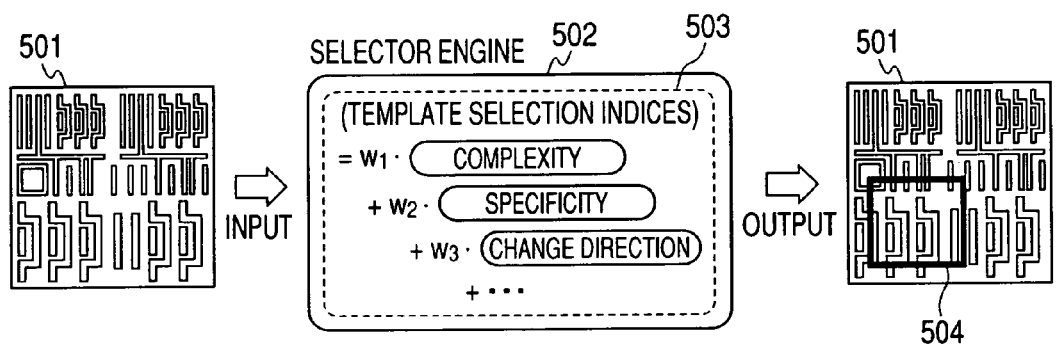
FIG. 6A is a diagram showing a structure of an imaging point selector engine in an image recipe arrangement unit.
Figure 6B:
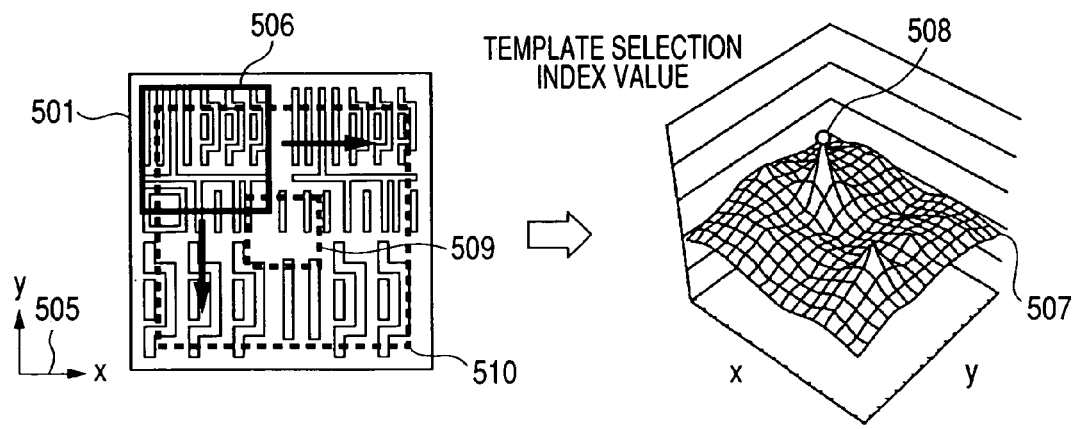
FIG. 6B is a diagram showing the process flow of selecting an imaging point from a low-magnification image using a set of template selection index data.

An example of a structure of the above selector engine is shown in FIG. 6A. Selector engine 502 (806 or 809) receives a low-magnification image 501 as an input, and outputs an imaging point 504 to a GUI or the like. An example of a method of selecting an imaging point by the selector engine 502 is described next. The selector engine 502 contains index value (index data) to judge whether a particular imaging point is appropriate for any region of the input low-magnification image 501. Hereinafter, the index value is called "selection indices", which are equivalent to the template selection indices 503 shown in FIG. 6A. As shown in FIG. 6B, a region 506 with a given region size in the low-magnification image 501 is scanned in arbitrary steps in x- and y-directions with respect to an xy coordinate system 505, and the above selection index value is calculated at various places. This yields a distribution 507 of the above selection index value in the low-magnification image, and for instance, a point 508 at which a maximum value of the distribution has been obtained is selected as the imaging point.

In the above description, the selection index value has been calculated for the entire low-magnification image, and the imaging point having the maximum value of the index value has been selected. Depending on the kind of selection point, however, arbitrary restriction conditions can be provided in that selection region. For instance, when AP is assumed as the selection point, it is possible to impose such restriction conditions that require AP and EP not to overlap in terms of template region, and that require AP and EP to exist within a range which enables both points to be moved by beam shifting.

The above is described in further detail below using FIG. 6B. If the place marked with a dotted-line frame 509 in the figure is predetermined as the portion where EP exists, and the range in which the imaging point (AP) can be moved from EP 509 by beam shifting is defined as a dotted-line frame 510, a search range for AP is set to lie a region where a region 509 was subtracted from a region 510.

An automatic selection method for the coordinates of an imaging point assuming a known template size has been shown in the foregoing example. Automatic selection of a template size to be used, however, is also possible by, for example, first calculating the above selection index value while changing the template size, and then determining a new template size that maximizes the selection index value. In addition, any necessary restriction conditions can be provided for the changing range of the template size.

The above selection indices are described next. As described in the foregoing example, several selection index values to judge to be suitable as the imaging picture point are thought. The above selection index value in the present invention, however, has a feature in that several selection criterions that should be considered in the selection of imaging points are combined to form the index value having combined selection criterions. A digitized form of the above "several selection criterions that should be considered in the selection of imaging points" is called "selection factor index value", and the above "combined selection criterions" are called "selection indices". These indices would include, for example, an index difficult to quantitatively express, such as "there is a strong or weak tendency," "arbitrary patterns are included or not included" and others, or an index difficult to express as a successive value. Using a method such as encoding, however, makes it possible to handle these indices similarly to the digitized selection factor index value mentioned above, so the following collectively discusses the selection indices and the selection factor index data:

Appropriateness of the selection criterions (selection rules) in the selection factor index value differs according to the point to be selected, the kind of object to be imaged, imaging conditions to be used (an imaging magnification and image quality factors such as a dose, focus, and stigmatism of electron beam), and/or the kind of hardware to be used (e.g., SEM apparatus or CD-SEM apparatus). The selection factor indices used for AP would include, for example, complexity of patterns, specificity thereof, a change direction of pattern shape (such as whether the shape of the pattern changes in x- and y-directions), a coarseness/fineness level of the pattern, a deformability level thereof (e.g., whether any differences between the pattern generated during light exposure/development, and the pattern in design data, easily change with changes in manufacturing conditions), or matching characteristics (whether a shift in position easily occurs during matching between a CAD image and a SEM image, or whether stable matching results can be obtained). The selection factor indices used for EP would include, for example, the complexity of the pattern, the deformability level thereof, a pattern size (a dimension value such as line width, pattern-to-pattern distance, or relationship in position between upper-layer and lower-layer contact holes), design margins (an index indicative of resistance of device characteristics to pattern deformation or to variations in positional shift or the like), or fineness or complexity levels of optical proximity correction (OPC).

Several methods are usable to calculate one set of selection indices by combining two or more of the above selection factor indices. In the following description, the above selection factor indices are linearly coupled to generate one set of selection indices (hereinafter, the coefficient "$w_n$," used for linear coupling is called a weight):

(Selection index set)=$\Sigma w_n \times$(nth selection factor index) (n=1, 2, etc. up to N)

By way of example, the selection indices 503 shown in FIG. 6A are generated by linearly coupling selection factor indices (a complexity level, specificity, a change direction, and other factors) using weights such as "$w_1$", "$w_2$", and "$w_3$". The weights denoted as "$w_n$" are arbitrarily adjustable parameters that determine a degree of incorporating each selection factor index into the selection indices.

3.2: Learning by the Selector Engine

In the foregoing selector engine 502, selection indices (more specifically, the selection factor indices and respective weights "$w_n$" in the above example) must be set beforehand. In addition, these settings must be modified if wrong processing results on imaging points are output during selector engine processing after the setting operations. However, the setting operations usually are not easy and require knowledge of the selection factor indices and the respective weights.

The present invention, therefore, features learning the above weights on the basis of teaching, and optimizing these weights. The selection of selection factor indices can likewise be achieved by weight optimization based on teaching (that is, unnecessary selection factor indices are each weighted with zero). However, as described above, when there is a certain degree of preliminary knowledge such as "these selection factor indices seem to be effective for AP selection" or "these selection factor indices seem to be effective for EP selection", a more effective method will be by extracting selection factor indices likely to be effective, beforehand according to particular needs, and then optimizing the weights of the above selection factor indices by means of teaching. This is because a smaller number of parameters to be determined (in this example, a small number of weights) usually results in the number of learning samples being correspondingly reduced, thus providing greater ease in learning.

FIG. 7 schematically represents the way a selection index set changes during learning.

Learning AP selection rules, for example, is described below using FIG. 7A.

First, a position 604 of AP (i.e., a teaching position of a point which is to be selected) is taught in a pair with a low-magnification image 601. The teaching position 604 can be assigned to one AP position as in FIG. 7A, or when a plurality of AP candidates exist, a plurality of teaching positions may be specified directly or as a region. Hereinafter, the thus-specified positions are collectively called a teaching region. In a selector engine 602, weights within a selection index set 606, such as "$t_1$", "$t_2$", and "$t_3$", are learnt for higher selection indices in the teaching region 604 of AP. A distribution of each selection factor index value is first calculated as an example of a learning method. Since giving weights uniquely determines the distribution of the selection indices, weights that causes the above selection index value in the teaching region to become greater than selection index value of all other teaching regions can be calculated by changing the weighting method. Consequently, the AP selection results obtained from the selection indices after learning will be as shown in a region 608 (an output position of the selected point). This region, although not exactly the same as the teaching region, can be expected to result in a tendency of a similar pattern being selected.

If a region 605 (a teaching position of a point to be selected), namely, a region different from the teaching region 604, is specified as the teaching region of AP, weights within a selection index set 607, such as "$u_1$", "$u_2$", and "$u_3$", are likewise learnt for higher selection indices in the teaching region 605 as well. For the selection indices after learning, therefore, a region 609 close to the teaching region 607 is selected as an output position of the selected point.

Learning EP selection rules, for example, is described below using FIG. 7B. The learning method applied in this example is essentially the same as the method shown for AP in FIG. 7A. Output results vary according to a manner in which teaching regions are assigned. For example, when teaching regions 610 and 611 are assigned as teaching positions of points to be selected, respective output regions (output positions of the selected points) will be 614 and 615, respectively. However, this case differs from the case of EPs in two respects. One is that because of high-magnification imaging for critical dimension measurement, EPs 610 and 611 are small in template size, compared with APs 604 and 605. The other is that different selection factor indices would be selected. As described above, the selection of selection factor indices is achievable by weight optimization based on teaching (that is, unnecessary selection factor indices are each weighted with zero). However, in the examples of FIGS. 7A and 7B, during AP selection, a complexity level, specificity, a change direction, and other factors are extracted using preliminary knowledge, and during EP selection, a complexity level, a deformability level, and process margins are extracted in a similar manner.

Figure 7A:
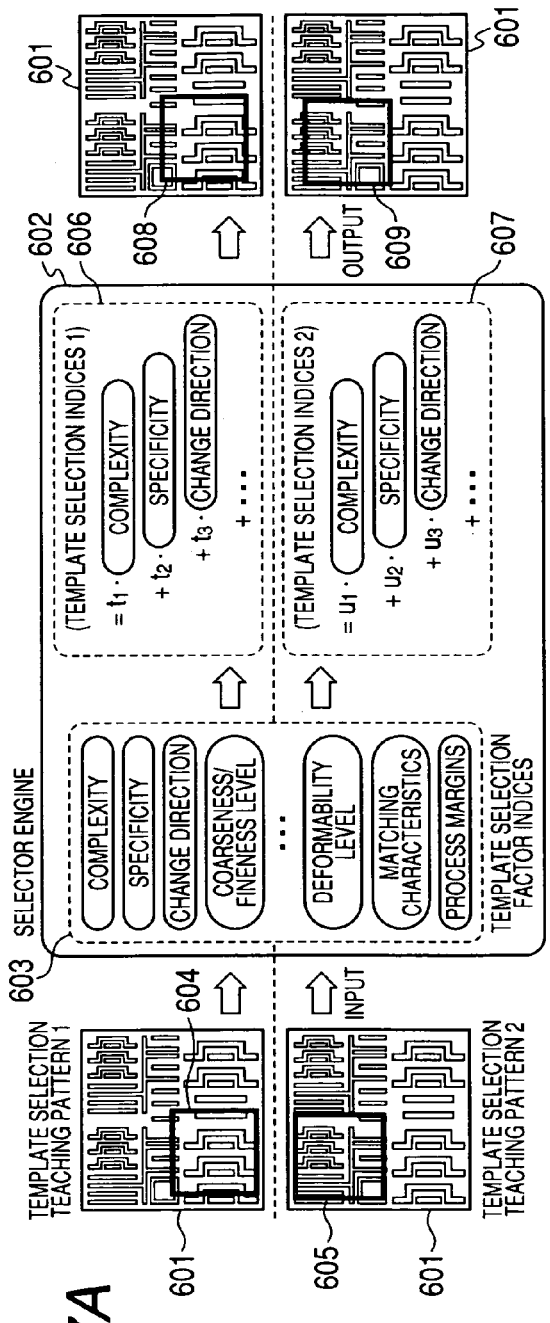
FIG. 7A is a diagram showing an example of a learning method concerning AP selection rules within the imaging point selector engine of the above-mentioned image recipe arrangement unit.
Figure 7B:
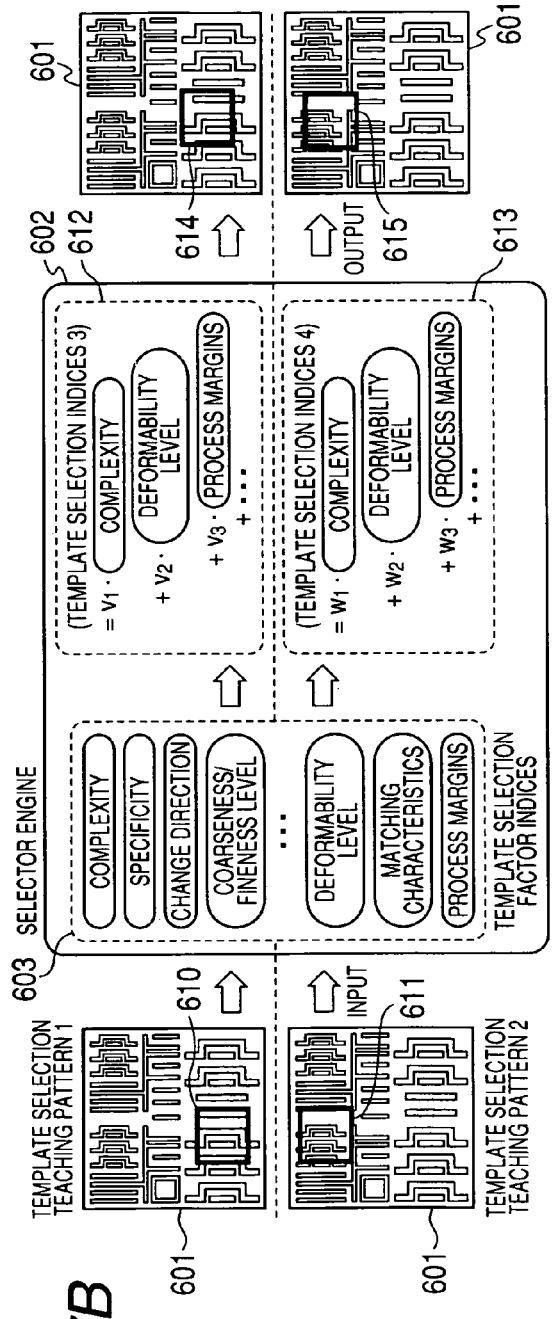
FIG. 7B is a diagram showing an example of a learning method concerning EP selection rules within the imaging point selector engine of the above-mentioned image recipe arrangement unit.

As schematically shown in FIGS. 7A and 7B, selection indices are constructed so as to be selectively extracted from the plurality of selection indices 603. Also, for reasons such as any differences in the kind of search template between AP, FP, SP, BP, EP, and the like, or a change in the kind of object to be imaged, or changes in imaging conditions (imaging magnification, image quality, and the like), or advent of non-assumed new template selection criteria, new selection factor indices may become necessary or conversely, any selection factor indices may become unnecessary. Even in such cases, however, it is possible to easily add or delete these selection factor indices. To add a new selection factor index, for example, this index can be easily included without changing a framework of the entire system, merely by adding only a calculating portion for the new selection factor index.

3.3: Process Flow of Automatic Imaging-recipe Arrangement

An example of total process flow of automatic imaging-recipe arrangement will be described below using FIG. 8.

First, the image-processing and recipe arrangement/arithmetic unit (CPU) 806 or 809 conducts the learning of the template selector engine (step S85). The learning step S85 for the selector engine can be conducted for each imaging point (AP, FP, SP, BP, EP), each imaging position, each set of imaging conditions (imaging magnification (field size), image quality, and the like), or each object to be imaged (includes each object obtained in each manufacturing process). Several variations are usable as learning methods in S85. Some of the variations are enumerated below.

(1) On a GUI screen, a learning low-magnification image 704 (CAD data or SEM data) is input and then in step S81, the user selects a desired imaging point on the low-magnification image.

(2) Imaging recipe information that was created or acquired during any previous SEM observation or learning, or an existing low-magnification image 704 (CAD data or SEM data), or the position and template of an observed imaging point, or an imaged object (manufacturing process included), or an existing imaging conditions, and learning parameters (weighting information, combinations of extracted selection factor indices, and the like) are saved in a database 805 (hereinafter, the above data is collectively called the past data). In step S85, a data set suitable for the selection of a desired template is extracted from the past data saved within the above database 805, and learnt with reference to the database. The past data saved within the database 805 includes the past data such as the imaging recipe information that was manually created in step S83 before learning in step S86, or information such as the past data selected in later-described steps S86 and S89 by the selector engine in the present invention. In other words, the vast amounts of imaging recipe information and other past data that an operator has created in the past can be utilized as learning samples for the system. Also, even if no database is stored, saving in the database 805 the past data created from that point of time makes it effective to manage the past data, since automatic arrangement of imaging recipes becomes possible when sufficient past data is stored for teaching.

(3) The learning parameters (weighting information, combinations of extracted selection factor indices, and the like) for the selector engine that was made to learn before saving in the database 805 are loaded into the system and then these learning parameters are used intact or used as default values of learning or modification.

Next, in step S86, the position of the imaging point and the imaging conditions (template size and data) are determined using the selector engine that was made to learn in step S85. Determination results in step S86 are examined in step S87, and if the results are judged not to be satisfactory, control is returned to step S85 to repeat learning. If satisfactory results are obtained, the learning step is completed and control is transferred to operating steps.

In the operating steps, automatic determination of an imaging point from an acquired low-magnification image 708 (CAD data or SEM data) is possible in step S89. If, in step S91, re-learning is judged to be unnecessary, however, operation is continued in step S92. If, in step S91, re-learning is judged to be necessary, control is returned to the learning step S85.

4: GUI in the Image-processing and Recipe Arrangement/Arithmetic Unit (CPU)

An example of a GUI on teaching or result display in, for example, the image-processing and recipe arrangement/arithmetic unit (CPU) 806 or 809 according to the present invention, will be described below.

There are several variations as methods of teaching GUI-based imaging points similarly to the imaging point 604, 605, 610, or 611 shown for the low-magnification image 601 in FIG. 7A or 7B. Typical teaching methods are enumerated below.

(1) Similarly to the imaging point 604, 605, 610, or 611 in FIG. 7A or 7B, an imaging point is specified using an appropriate input method such as operating a mouse or entering numeric data with a GUI-connected keyboard. It is possible to specify a size as well as a position.

(2) A plurality of imaging point candidates 902 to 905 (teaching positions of points to be selected) on the low-magnification image 901 shown in FIG. 9A are specified using the appropriate input method such as operating the mouse or entering numeric data with the GUI-provided keyboard.

(3) One of the imaging-point setup region candidates separated by, for example, a dotted line (imaging-point candidate boundary line) 906 on the low-magnification image 901 of FIG. 9B, is specified using the appropriate input method such as moving a mouse pointer 907. FIG. 9B shows an example in which a region 908 is selected as a teaching position of a point to be selected.

(4) Similarly to the region 910 or 911 shown in FIG. 9C as a teaching region that includes imaging points to be selected, a region for setting up imaging points to be selected is specified on the low-magnification image 901 of FIG. 9C by drawing a free curve using the appropriate input method such as moving the mouse pointer 909. Two or more segmented regions can be specified at the same time similarly to the above regions 910, 911.

The system has a function that supports the specification of the above imaging point(s) by displaying the setup-prohibiting region (for AP specification, EP setup region) shown as, for example, 509 in FIG. 6B, or a specification-permitting range (for AP specification, range in which the imaging point can be moved by beam shifting) shown as 510. The display is based on restriction conditions on a range specifiable for the imaging point(s). In addition, when teaching shown in FIGS. 9A to 9C is conducted on plural low-magnification images and learning is conducted using the plural low-magnification images, the selector engine can be made to learn such general-purpose weighting of the low-magnification images that provides higher learning performance.

Figure 12:
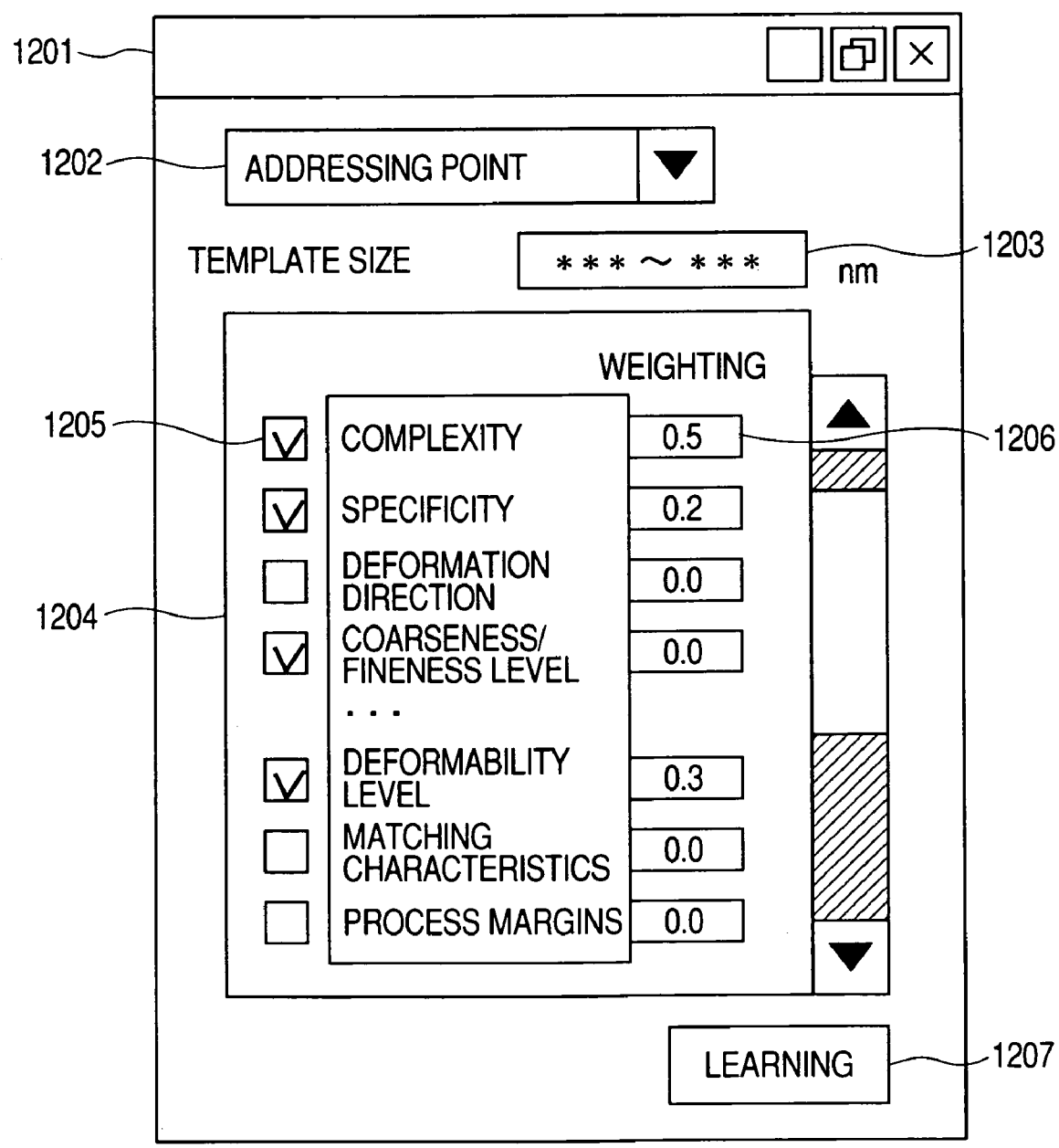
FIG. 12 is a view showing an example of a screen mode which uses a GUI connected to the imaging recipe arrangement unit of the present invention in order to cause the arrangement unit to select selection factor indexes and learn weighting.

During learning, the selection and the weighting of the above selection factor indices can be learned by using, for example, the GUI-based selector engine learning window 1201 shown in FIG. 12. First, a pull-down menu 1202 or the like is used to specify the kind of imaging point (in the figure, AP), and a textbox 1203 or the like is used to specify a template size (for a square region, length of one side) or a range or the like. The template size can be specified either by one value or by a settable range (for example, a range from *nm to *nm). In the latter case, an appropriate template size can be determined from the above range by learning.

Also, a plurality of factor selection indices listed in a window 1204 which displays learning results for the selection and the weighting of selection factor indices are selected by using an input element (unit) such as a checkbox 1205 to select whether a particular selection factor index is to be rendered usable. Weighting between checkbox-selected selection factor indices, is learned based on the teaching region specified using any such teaching method as shown in FIGS. 9A to 9C, by pressing a learning start button 1207. The GUI 901 shown therein, and the GUI-based selector engine learning window 1201 in FIG. 12 can be displayed in the same screen mode. In the window 1204, since four selection factor indices, namely, a complexity level, specificity, a coarseness/fineness level, and a deformability level, are selected as an example, learning is conducted for these selection factor indices. After this, weighting is learned for the four selection factor indices and then each weight is displayed in a textbox 1206 which displays weighting between the selection factor indices. Selection factor indices other than the above four are each weighted with zero. After learning, however, a case in which the four selection factor indices are also weighted with zero could occur (in the example of FIG. 12, a weight of zero is assigned as the coarseness/fineness level).

In addition, there is provided an input support function intended for purposes such as displaying, when the kind of imaging point is selected, a value of the template size, a default value of the settable range, or a default value of a selection factor index to be selected using the checkbox.

A typical method of displaying the imaging points that have been calculated by, for example, the selector engine in the image-processing and recipe arrangement/arithmetic unit (CPU) 806 or 809 according to the present invention, will be described below. On the low-magnification image 901 of FIG. 9D, calculated imaging point candidates are displayed as, for example, output positions 912-914 of the points selected. A specified N number of higher-order imaging point candidates can be displayed (N is any value, and priority levels are determined by selection index value or the like). Also, priority levels of any candidates 912-914 displayed as options, and selection index data indicative of whether the particular imaging point is appropriate, that is, the foregoing selection index data or the like can be displayed as 912B-914B, for example. At 912B, for instance, "1" is displayed as a priority level, and "0.90" as an index value.

Figure 10:
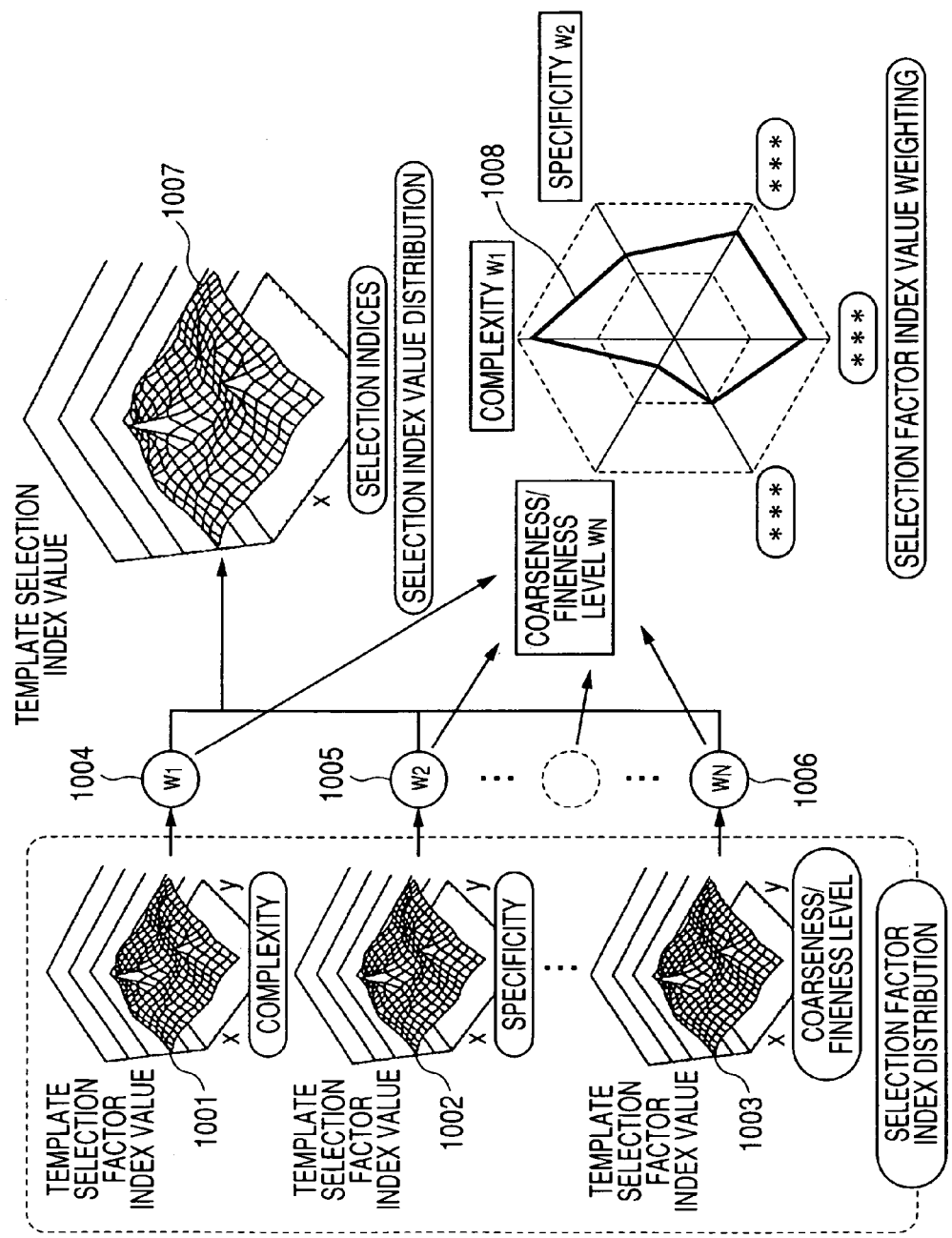
FIG. 10 is a diagram showing an example of distributions of the selection index data, of selection factor index values and of weighting information between the selection factor index values as selection rules for selecting the image points.

In order to conduct validity verifications on the selector engine itself and on the above selector engine output results or analyze an imaging point selection tendency, the above selection index value (data) or selection factor index value (data) or learnt weighting information between selection factor indices can be displayed in GUI-based screen mode or output as a file. An example of display is shown in FIG. 10. A distribution of selection factor index value is shown as 1001-1003. In FIG. 10, a distribution of selection factor index value concerning a complexity level, specificity, and a coarseness/fineness level, is shown as an example (the symbol " . . . " in the figure indicates that the display could include other arbitrary selection factor indices). Also, selection factor index weight value for calculating selection indices is shown as 1004-1006, and a selection factor index weight chart 1008 is displayed to analyze a tendency of the weight data 1004-1006.

The chart 1008 is a graphic summary of the weight value 1004-1006. It can be seen from the chart 1008 that a selection rule with the greatest importance attached to "Complexity" and the least importance attached to "Coarseness/fineness level" is employed in the present embodiment. Assigning such visibility enables the operator's selection criterions to be displayed explicitly. A diagram 1007 represents a distribution of selection factor indices and a distribution of the selection indices that have been calculated from weighting information. These distributions can also be displayed with contour lines. An example of the display is shown as 915 in FIG. 9E. In addition, the low-magnification image 901 can be displayed in overlapped form on the above contour lines 915.

Figure 11:
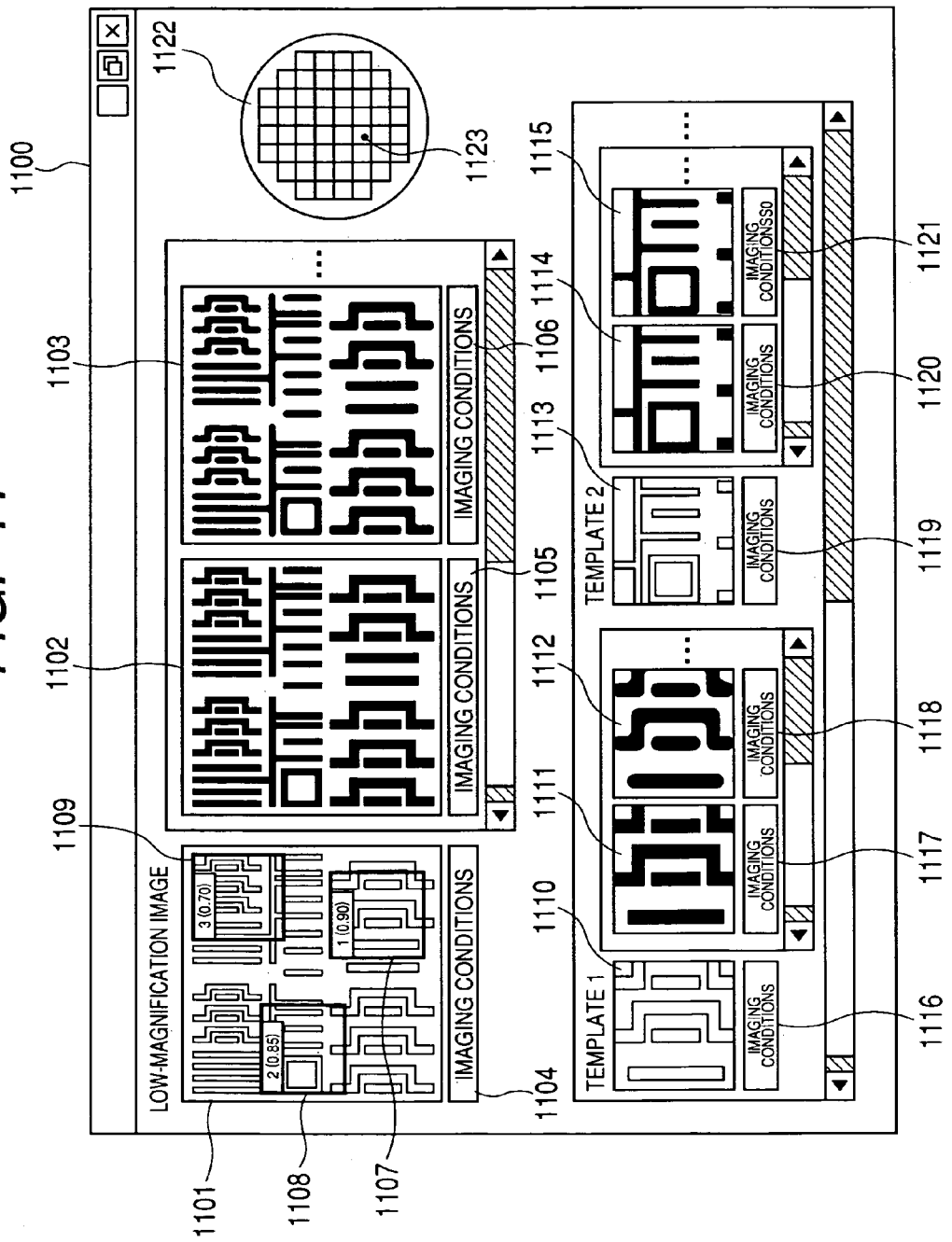
FIG. 11 is a view showing a screen mode in which a low-magnification image and a CAD image and SEM image of an imaging point are simultaneously monitored using a GUI connected to the imaging recipe arrangement unit of the present invention.

Such low-magnification images and imaging points as displayed in GUI-based screen mode 1100 of FIG. 11 can be simultaneously observed to confirm the templates in selected imaging points. Part or all of a low-magnification CAD image 1101, a low-magnification SEM image 1102 or 1003 associated the CAD image 1101, a position 1107-1109 of an imaging point, a CAD template 1110 or 1113 of the imaging point, a SEM image 1111, 1112, 1114, or 1115 of the CAD template 1110 or 1113, and a position 1123 of the low-magnification image 1101 or template 1110 (or the like) on a wafer 1122, can be simultaneously displayed in the above simultaneous observing screen mode. A plurality of CAD template images, for example, 1110 and 1113 are displayed in FIG. 11, and it is possible either to simultaneously display a plurality of template candidates in this way or to simultaneously display different kinds of templates, for example, AP and EP templates.

Also, plural imaging points are likely to be registered in an imaging recipe to provide against a failure in addressing the foregoing imaging point. In addition, plural low-magnification SEM images (e.g., 1102, 1103) are displayed for one low-magnification CAD image (e.g., 1101), and these low-magnification SEM images were obtained, for example, during operation, by imaging with the imaging recipe one after another at the AP positions pre-registered in the imaging recipe.

These low-magnification SEM images are likely to suffer changes such as slight shifts in position according to stage accuracy with each imaging operation, differences in view state of SEM image pattern due to differences in imaging conditions, or differences in imaged pattern shape due to changes in manufacturing process conditions. It is effective, therefore, to observe these low-magnification SEM images in such GUI-based screen mode 1100 as shown in FIG. 11, or to register these low-magnification SEM images in the imaging recipe. That is to say, when a plurality of low-magnification SEM images are registered as templates for one imaging point, even if an addressing failure, for example, occurs in one template of the SEM images, addressing with any other template of the SEM images is likely to result in successful processing.

Also, imaging conditions can be displayed in forms such as 1104-1106 or 1116-1121, respectively, for each CAD image and each SEM image. Each of these imaging conditions includes part or all of a field size, coordinates, manufacturing process conditions, and a layer number. In addition to these factors, the imaging conditions for the SEM image include those which were actually adopted for the SEM apparatus, an imaging date and time, and other information.

In addition, the imaging recipe arranging method, analytical method, display method, or file management method set forth in the description of the present invention can be used not only for the SEM, but also for an optical microscope or a scanning probe microscope (SPM) or the like. That is to say, since AP and EP setup is occasionally required for the optical microscope or the SPM as well, the heretofore-described SEM images, when processed in an SPM, for example, will be either the depth information acquired from the SPM, or the images obtained by converting the depth information (i.e., converting depth data into brightness data of the image).

As described above, according to the present embodiment, the following seven operational advantageous effects are yielded:

(1) Automatic arrangement of imaging recipes is possible.

(2) Selection rules for automatic arrangement of imaging recipes can be easily established by conducting processes such as teaching or weighting adjustment, so it is possible to respond rapidly to changes in manufacturing process, and changes in manufacturing process of object imaging and in the imaging conditions themselves, and in other factors.

(3) Selection factor indices in selection rules can be easily added/deleted. As a result, it is possible to correspond promptly to the demand of the new selection criterion that cannot be expressed with a current system without changing the framework of entire such system.

(4) The vast amounts of imaging recipes and other past data that the operator has created in the past can be utilized availably as learning samples for the system of the present invention by storing the past data into a database.

(5) The adequacy of the imaging points that have been selected in accordance with the above-mentioned selection rules can be easily judged by displaying one or plural template position candidates in overlapped form on the SEM image displayed in GUI-based screen mode.

(6) Displaying a plurality of template position candidates or a distribution of selection indices or selection factor indices enables a user to analyze a tendency of appropriate template regions and thus to evaluate the validity of selection results and/or selection rules.

(7) The template selection criterons that are the operator's knowledge can be made visible and explicitly displayable by displaying the weighting information between the selection factor indices mentioned above.

The present invention can be applied to a SEM apparatus such as a CD-SEM.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes that come within the meaning and range of equivalency of the claims are therefore intended to be embraced therein.

What is claimed is:

1. An apparatus for arranging a recipe for imaging with a scanning electron microscope, the apparatus comprising:
 a database which receives and stores layout information on a circuit pattern formed on a semiconductor wafer;
 an input means which inputs arranging conditions of an imaging-recipe; and
 an imaging-recipe arranging means which arranges the imaging-recipe determining an imaging sequence for acquiring SEM images in order to measure dimensions of the circuit pattern, and a portion to be imaged and imaging conditions to be used in the imaging sequence, by using the layout information on the semiconductor wafer circuit pattern stored into the database;
 wherein, the imaging-recipe arranging means sets a first region including a second region for acquiring a SEM image intended to measure the circuit pattern as the portion to be imaged in the imaging sequence, and a third region for imaging to evaluate a shift in position between the SEM image of the pattern in the first region and an image template corresponding to the SEM image of the pattern at a portion different from the second region in the first region, on the basis of the arranging conditions of the imaging-recipe inputted by the input means.

2. The apparatus according to claim 1, wherein the imaging-recipe arranging means sets, in addition to the first region the second region and the third region, at least one of a fourth region for adjusting focus of an electron beam with the SEM, a fifth region for conducting stigmatism corrections on the electron beam with the SEM, and a sixth region for adjusting brightness and contrast levels of the SEM image, at a position where at least one from the fourth region to the sixth region does not overlap the second region in the first region as the portion to be imaged in the imaging sequence, on the basis of the arranging conditions of the imaging-recipe inputted by the input means.

3. The apparatus according to claim 1, wherein the imaging-recipe arranging means sets a magnification for imaging in the third region being lower than a magnification for imaging in the second region as one of the imaging conditions to be used in the imaging sequence.

4. The apparatus according to claim 1, wherein the imaging-recipe arranging means sets a magnification for imaging in the fourth, fifth, or sixth region being essentially the same as a magnification for imaging in the second region as one of the imaging conditions to be used in the imaging sequence.

5. The apparatus according to claim 1, wherein the layout information of the circuit pattern is an image acquired using the scanning electron microscope, or CAD data that describes design information on the semiconductor pattern, or a CAD image obtained by converting into image data the CAD data that describes design information on the semiconductor pattern.

6. The apparatus according to claim 1, wherein in the imaging-recipe arranging means, selection rule that determines the portion to be imaged in the imaging sequence are optimized by teaching.

7. The apparatus according to claim 6, wherein the selection rule is a set of selection indices constructed by combining a plurality of selection factor indices.

8. The apparatus according to claim 6, wherein the selection rule is a set of selection indices formed by linear coupling which uses weighting of plural selection factor indices.

9. The apparatus according to claim 7, wherein the selection factor indices include one, more than one, or all of a complexity level of the pattern, a uniqueness thereof, a direction of changes in a shape thereof, a coarseness/fineness level thereof, a deformability level thereof, matching characteristics between a CAD image and a SEM image, dimensions of the pattern, design margins, and fineness and complexity levels of optical proximity correction.

10. The apparatus according to claim 1, wherein one, more than one, or all of the imaging recipe, the object to be imaged, the imaging conditions, and selection rule for determining the portion to be imaged in the imaging sequence, is further saved in the database and shared between a plurality of scanning electron microscopes.

11. The apparatus according to claim 1, wherein one, more than one, or all of the imaging recipe, the object to be imaged, the imaging conditions, and selection rule for determining the portion to be imaged in the imaging sequence, is further saved in the database and used for teaching in the imaging-recipe arranging means.

12. The apparatus according to claim 1, wherein, in the imaging-recipe arranging means, coordinates of imaging point candidates being the imaging recipe, or one of a distribution of the selection indices, a distribution of the selection factor indices and weighting information between the selection factor indices, being selection rule for determining the portion to be imaged in the imaging sequence, is displayed in a GUI-based screen mode or output as a file.

13. A method of arranging a recipe for imaging with a scanning electron microscope, the method comprising the steps of:
    storing layout information on a circuit pattern formed on a semiconductor wafer into a database;
    inputting arranging conditions of an imaging-recipe; and
    arranging the imaging-recipe determining an imaging sequence for acquiring SEM images in order to measure dimensions of the circuit pattern, and a portion to be imaged and imaging conditions to be used in the imaging sequence, by using the layout information on the semiconductor wafer circuit pattern stored into the database;
    wherein, the imaging-recipe arranging step includes a step of setting a first region including a second region for acquiring a SEM image intended to measure the circuit pattern as the portion to be imaged in the imaging sequence, and a step of setting a third region for imaging to evaluate a shift in position between the SEM image of the pattern in the first region and an image template corresponding to the SEM image of the pattern at a portion different from the second region in the first region, on the basis of the arranging conditions of the imaging-recipe inputted by the input step.

14. The method according to claim 13, wherein, in the imaging-recipe arranging step further includes a step of setting, in addition to the first region, the second region and the third region, at least one of a fourth region for adjusting focus of an electron beam with the SEM, a fifth region for conducting stigmatism corrections on the electron beam with the SEM, and a sixth region for adjusting brightness and contrast levels of the SEM image, at a position where at least one from the fourth region to the sixth region does not overlap the second region in the first as the portion to be imaged in the imaging sequence on the basis of the arranging conditions of the imaging-recipe inputted by the input step.

15. The method according to claim 13, wherein, in the imaging-recipe arranging step further includes a step of setting a magnification for imaging in the third region being lower than a magnification for imaging in the second region as one of the imaging conditions to be used in the imaging sequence.

16. The method according to claim 13, wherein, in the imaging-recipe arranging step further includes a step of setting a magnification for imaging in the fourth, fifth or sixth region being essentially the same as a magnification for imaging in the second region as one of the imaging conditions to be used in the imaging sequence.

17. The method according to claim 13, wherein the layout information of the circuit pattern is an image acquired using the scanning electron microscope, or CAD data that describes design information on the semiconductor pattern, or a CAD image obtained by converting into image data the CAD data that describes design information on the semiconductor pattern.

18. The method according to claim 13, wherein the imaging-recipe arranging step further includes a step of optimizing selection rule for determining the portion to be imaged in the imaging sequence, by teaching.

19. The method according to claim 18, wherein the selection rule is a set of selection indices constructed by combining a plurality of selection factor indices.

20. The method according to claim 18, wherein the selection rule is a set of selection indices formed by linear coupling which uses weighting of plural selection factor indices.

21. The method according to claim 18, wherein the selection factor indices include one, more than one, or all of a complexity level of the pattern, a uniqueness thereof, a direction of changes in a shape thereof, a coarseness/fineness level thereof, a deformability level thereof, matching characteristics between a CAD image and a SEM image, dimensions of the pattern, design margins, and fineness and complexity levels of optical proximity correction.

22. The method according to claim 13, wherein one, more than one, or all of the imaging recipe, the object to be imaged, the imaging conditions, and selection rule for determining the portion to be imaged in the imaging sequence, is further saved in the database and shared between a plurality of scanning electron microscopes.

23. The method according to claim 13, wherein one, more than one, or all of the imaging recipe, the object to be imaged, the imaging conditions, and selection rule for determining the portion to be imaged in the imaging sequence, is further saved in the database and used for teaching in the imaging-recipe arranging step.

24. The method according to claim 13, wherein, in the imaging-recipe arranging step, coordinates of imaging point candidates being the imaging-recipe, or one of a distribution of the selection indices that are the selection rules, a distribution of the selection factor indices and weighting information between the selection factor indices, is displayed in a GUI-based screen mode or output as a file.

25. An apparatus for evaluating a shape of a semiconductor pattern, the apparatus comprising:
    a scanning electron microscope; and
    an imaging-recipe arranging unit for the scanning electron microscope, which arranges an imaging-recipe for observing the semiconductor pattern on a semiconductor wafer through the scanning electron microscope;
    wherein the imaging-recipe arranging unit for the scanning electron microscope further includes:
        a database which receives and stores layout information on a circuit pattern formed on a semiconductor wafer;
        an input means which inputs arranging conditions of the imaging recipe; and
        an imaging-recipe arranging means which arranges the imaging-recipe determining an imaging sequence for acquiring SEM images in order to measure dimensions of the circuit pattern, and a portion to be imaged and imaging conditions to be used in the imaging sequence, by using the layout information on the semiconductor wafer circuit pattern stored into the database;
        wherein, the imaging-recipe arranging means sets a first region including a second region for acquiring a SEM image intended to measure the circuit pattern as the portion to be imaged in the imaging sequence, and a third region for imaging to evaluate a shift in position between the SEM image of the pattern in the first region and an image template corresponding to the SEM image of the pattern at a portion different from the second region in the first region, on the basis of the arranging conditions of the imaging recipe inputted by the input means.

26. The apparatus according to claim 25, wherein the imaging-recipe arranging means sets, in addition to the first region, the second region and the third region, at least one of a fourth region for adjusting focus of an electron beam with the SEM, a fifth region for conducting stigmatism corrections on the electron beam with the SEM, and a sixth region for adjusting brightness and contrast levels of the SEM image, at a position where at least one from the fourth region to the sixth region does not overlap the second region in the first region as the portion to be imaged in the imaging sequence, on the basis of the arranging conditions of the imaging-recipe inputted by the input means.

27. The apparatus according to claim 25, wherein the imaging-recipe arranging means sets a magnification for imaging in the second region being lower than a magnification for imaging in the second region as one of the imaging conditions to be used in the imaging sequence.

28. The apparatus according to claim 25, wherein the imaging-recipe arranging means sets a magnification for imaging in the fourth, fifth or sixth region being essentially the same as a magnification for imaging in the second region as one of the imaging conditions to be used in the imaging sequence.

29. The apparatus according to claim 25, wherein the layout information of the circuit pattern is an image acquired using the scanning electron microscope, or CAD data that describes design information on the semiconductor pattern, or a CAD image obtained by converting into image data the CAD data that describes design information on the semiconductor pattern.

* * * * *